US011423988B2

(12) United States Patent
Tortorelli et al.

(10) Patent No.: US 11,423,988 B2
(45) Date of Patent: Aug. 23, 2022

(54) PROGRAMMING TECHNIQUES FOR POLARITY-BASED MEMORY CELLS

(71) Applicant: Micron Technology, Inc., Boise, ID (US)

(72) Inventors: Innocenzo Tortorelli, Cernusco sul Naviglio (IT); Mattia Boniardi, Cormano (IT); Mattia Robustelli, Milan (IT)

(73) Assignee: Micron Technology, Inc., Boise, ID (US)

( * ) Notice: Subject to any disclaimer, the term of this patent is extended or adjusted under 35 U.S.C. 154(b) by 151 days.

(21) Appl. No.: 17/005,928

(22) Filed: Aug. 28, 2020

(65) Prior Publication Data

US 2022/0068391 A1 Mar. 3, 2022

(51) Int. Cl.
| | | |
|---|---|---|
| *G11C 16/10* | (2006.01) | |
| *G11C 16/24* | (2006.01) | |
| *G11C 16/08* | (2006.01) | |
| *G11C 16/26* | (2006.01) | |
| *G11C 11/56* | (2006.01) | |

(52) U.S. Cl.
CPC ............ *G11C 16/10* (2013.01); *G11C 16/08* (2013.01); *G11C 16/24* (2013.01); *G11C 16/26* (2013.01); *G11C 11/5607* (2013.01)

(58) Field of Classification Search
CPC ............................ G11C 16/10; G11C 11/5607
USPC .............................................. 365/185.28, 158
See application file for complete search history.

(56) References Cited

U.S. PATENT DOCUMENTS

| | | | |
|---|---|---|---|
| 2010/0020606 A1 | 1/2010 | Yamada | |
| 2011/0310652 A1 | 12/2011 | Kim et al. | |
| 2015/0262661 A1 | 9/2015 | Chu et al. | |
| 2015/0287450 A1* | 10/2015 | Prejbeanu | ........... G11C 11/5607 365/158 |
| 2017/0271007 A1 | 9/2017 | Suzuki et al. | |
| 2019/0341112 A1 | 11/2019 | Castro | |

OTHER PUBLICATIONS

ISA/KR, International Search Report and Written Opinion of the International Searching Authority, Int'l Appl. No. PCT/US2021046104, dated Nov. 29, 2021, Korean Intellectual Property Office, Seo-gu, Daejeon, Republic of Korea, 9pgs.

* cited by examiner

*Primary Examiner* — Jason Lappas
(74) *Attorney, Agent, or Firm* — Holland & Hart LLP

(57) ABSTRACT

Methods, systems, and devices for programming techniques for polarity-based memory cells are described. A memory device may use a first type of write operation to program one or more memory cells to a first state and a second type of write operation to program one or more memory cells to a second state. Additionally or alternatively, a memory device may first attempt to use the first type of write operation to program one or more memory cells, and then may use the second type of write operation if the first attempt is unsuccessful.

25 Claims, 9 Drawing Sheets

PROGRAMMING TECHNIQUES FOR POLARITY-BASED MEMORY CELLS

BACKGROUND

The following relates generally to one or more memory systems and more specifically to programming techniques for polarity-based memory cells.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile.

DETAILED DESCRIPTION

Figure 1:
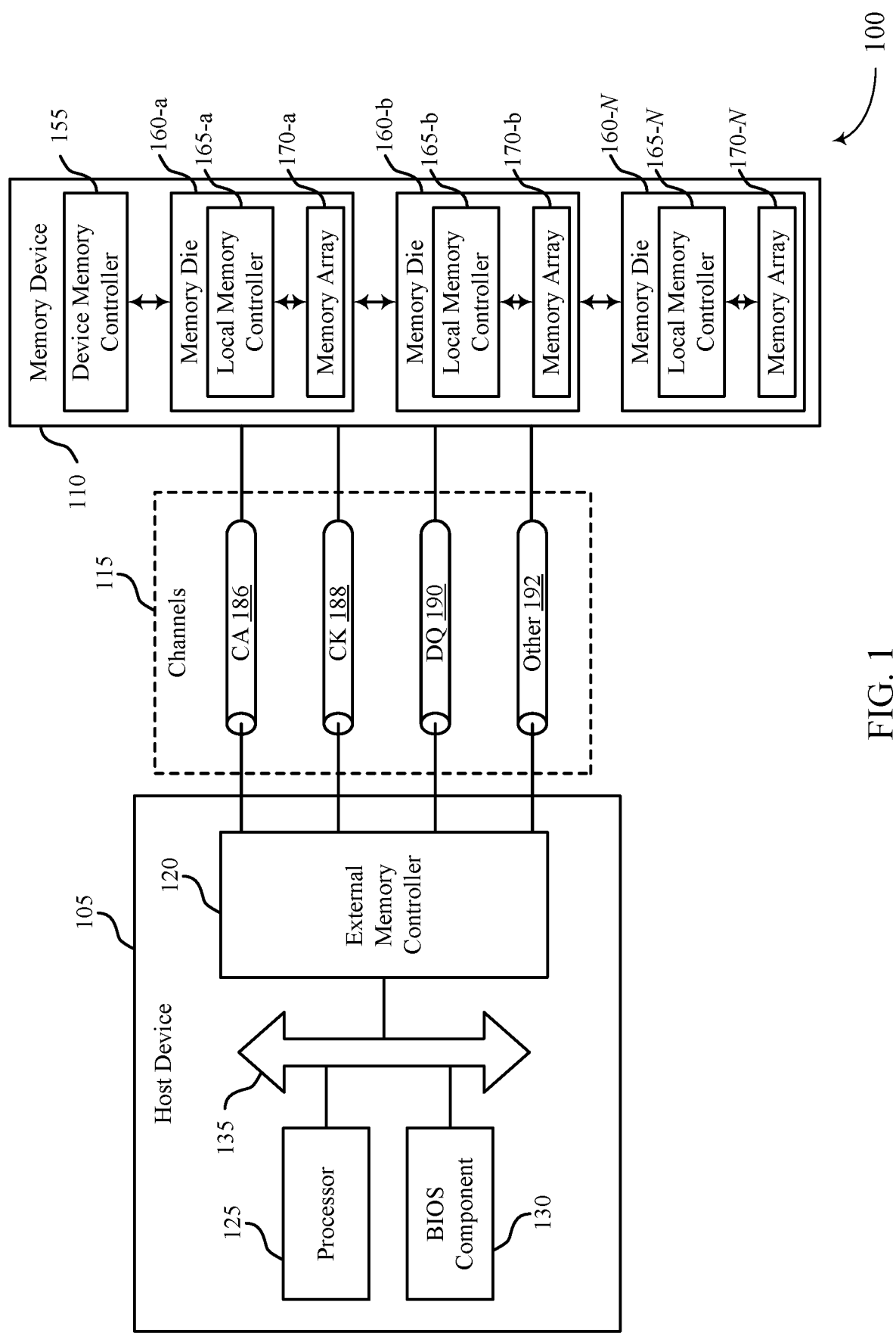
FIG. 1 illustrates an example of a system that supports programming techniques for polarity-based memory cells in accordance with examples as disclosed herein.

Some types of memory cells, which may be referred to as polarity-based memory cells, may be written (e.g., programmed) to different logic states using pulses (e.g., voltage pulses or current pulses) with different polarities. For example, a memory cell may be written to a first logic state using a pulse of a first polarity or a second logic state using a pulse of a second polarity.

In some examples, a memory device may write memory cells utilizing a first approach, which may be referred to herein as a "normal write" approach, and in which the memory device apply a program pulse to a memory cell in response to a write command for the memory cell if the logic state already stored by the memory cell is different than a target logic state associated with the write command but may otherwise refrain from applying a program pulse to the memory cell. For example, if the memory device receives a command to write a memory cell to a first logic state, the memory device may check whether the memory device is already storing the first logic state before applying a program pulse. If the memory cell is identified as storing a second logic state, the memory device may apply a program pulse to write the memory cell to the first logic state, but if the memory cell is identified as already storing the first logic state, the memory device may refrain from applying the program pulse.

In other examples, a memory device may write memory cells utilizing a second approach, which may be referred to herein as a "force write" approach, and in which the memory device may apply a program pulse to a memory cell in response to a write command for the memory cell irrespective of the logic state already stored by the memory cell. For example, if the memory device receives a command to write a memory cell to a second logic state, the memory device may apply a program pulse to the memory cell even if the memory cell already stores the second logic state. In some examples, performance tradeoffs may exist between the force write approach and the normal write approach—that is, each approach may have one or more advantages and disadvantages over the other.

Systems, techniques, and devices are described herein may utilize a combination of normal writes and force writes to leverage the respective advantages of the normal write and force write approaches within a single memory device while mitigating the impact of respective disadvantages. For example, memory cells may be written to one logic state (e.g., a first logic state) using the normal write approach and may be written to another logic state (e.g., a second logic state) using the force write approach. Additionally or alternatively, a memory device may first attempt to write memory cells using the normal write approach first and then using the force write approach in cases where the normal write approach is unsuccessful.

Features of the disclosure are initially described in the context of memory systems, dies, and arrays as described with reference to FIGS. 1-3. Features of the disclosure are described in the context of plots and process diagrams as described with reference to FIGS. 4-6. These and other features of the disclosure are further illustrated by and described with reference to an apparatus diagram and flowcharts that relate to programming techniques for polarity-based memory cells as described with references to FIGS. 7-10.

FIG. 1 illustrates an example of a system 100 that supports programming techniques for polarity-based memory cells in accordance with examples as disclosed herein. The system 100 may include a host device 105, a memory device 110, and a plurality of channels 115 coupling the host device 105 with the memory device 110. The system 100 may include one or more memory devices, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices 105. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory die 160 may include any quantity of stacked memory arrays 170 (e.g., two high, three high, four high, five high, six high, seven high, eight high). In some 3D memory dies 160, different decks may share at least one common access line such that some decks may share one or more of a row line or column line.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, the CA channel 186 may include a read command with an address of the desired data. In some examples, a CA channel 186 may include any number of signal paths to decode one or more of address or command data (e.g., eight or nine signal paths).

In some examples, data channels 190 may be operable to communicate one or more of data or control information between the host device 105 and the memory device 110. For example, the data channels 190 may communicate information (e.g., bi-directional) to be written to the memory device 110 or information read from the memory device 110.

When the memory device 110 receives a write command from the host device 105, the memory device may program a memory cell subject to the write command using either a normal write approach (e.g., the memory device 110 may apply a program pulse if the stored logic state of the memory cell is different than a target logic state associated with the write command and otherwise not apply a program pulse), or a force write approach (e.g., the memory device 110 may apply a program pulse to the memory cell irrespective of the logic state already stored at the memory cell), or a combination thereof. For example, the memory device 110 may use a normal write approach if the target logic state for the memory cell is a first logic state and may use a force write approach if the target logic state for the memory cells is a second logic state. As another example, the memory device 110 may utilize the normal write approach first and then utilize the force write approach if the normal write approach is unsuccessful. Thus, as described herein, the memory device 110 may implement a mixed normal write and force write approach to leverage the benefits of the different approaches while mitigating the drawbacks of the different approaches.

Figure 2:
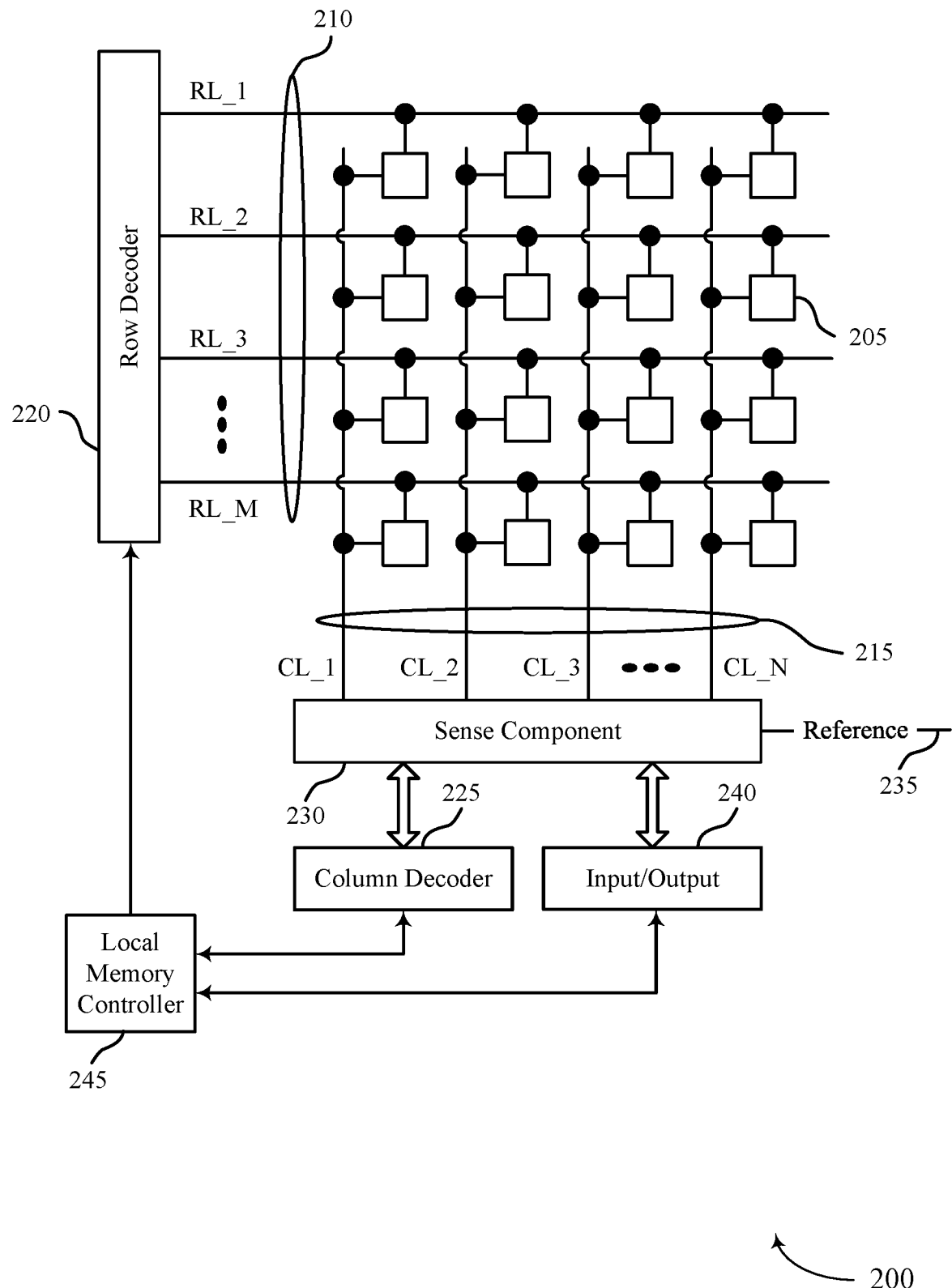
FIG. 2 illustrates an example of a memory die that supports programming techniques for polarity-based memory cells in accordance with examples as disclosed herein.

FIG. 2 illustrates an example of a memory die 200 that supports programming techniques for polarity-based memory cells in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., a programmed one of a set of two or more possible states) based on the polarity of one or more pulses (e.g., voltage pulses or current pulses) applied to the memory cell 205. For example, a memory cell 205 may be operable to store one bit of information at a time (e.g., a logic 0 or a logic 1). In some examples, a memory cell 205 (e.g., a multi-level memory cell 205) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a logic state using a configurable material, which may be referred to as a memory element, a memory storage element, a material element, a material memory element, a material portion, or a polarity-written material portion, among others. A configurable material of a memory cell 205 may refer to a chalcogenide-based storage component, as described in more detail with reference to FIG. 3.

The memory die 200 may include the access lines (e.g., row lines 210 and the column lines 215) arranged in a pattern, such as a grid-like pattern. Access lines may be formed of one or more conductive materials. In some examples, row lines 210 may be referred to as word lines. In some examples, column lines 215 may be referred to as digit lines or bit lines. References to access lines, row lines, column lines, word lines, digit lines, or bit lines, or their analogues, are interchangeable without loss of understanding or operation. Memory cells 205 may be positioned at intersections of the row lines 210 and the column lines 215.

Operations such as reading and writing may be performed on the memory cells 205 by activating or selecting access lines such as one or more of a row line 210 or a column line 215. By biasing a row line 210 and a column line 215 (e.g., applying one or more voltages to the row line 210 or the column line 215), one or more pulses may be applied to a memory cell 205 at their intersection in order to access the memory cell 205. The intersection of a row line 210 and a column line 215 in either a two-dimensional or three-dimensional configuration may be referred to as an address of a memory cell 205. An access line may be a conductive line coupled with a memory cell 205 and may be used to perform access operations on the memory cell 205.

Accessing the memory cells 205 may be controlled through a row decoder 220 or a column decoder 225. For example, a row decoder 220 may receive a row address from the local memory controller 245 and activate a row line 210 based on the received row address. A column decoder 225 may receive a column address from the local memory controller 245 and may activate a column line 215 based on the received column address.

The sense component 230 may be operable to detect a state (e.g., a material state, a resistance, a threshold state) of a memory cell 205 and determine a logic state (or alternatively, logic value) stored by the memory cell 205 based on the detected state. The sense component 230 may include one or more sense amplifiers to amplify or otherwise convert a signal resulting from accessing the memory cell 205 (e.g., a signal indicating whether the memory cell 205 exhibited a snapback event). The sense component 230 may compare a signal detected from the memory cell 205 to a reference 235 (e.g., a reference voltage). The detected logic state of the memory cell 205 may be provided as an output of the sense component 230 (e.g., to an input/output 240), and may indicate the detected logic state to another component of a memory device that includes the memory die 200.

The local memory controller 245 may control the accessing of memory cells 205 through the various components (e.g., row decoder 220, column decoder 225, sense component 230). The local memory controller 245 may be an example of the local memory controller 165 described with reference to FIG. 1. In some examples, one or more of the row decoder 220, column decoder 225, and sense component 230 may be co-located with the local memory controller 245. The local memory controller 245 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 245 may generate row signals and column address signals to activate the target row line 210 and the target column line 215. The local memory controller 245 may also generate and control various voltages or currents (e.g., pulses) used as described herein during the operation of the memory die 200. In general, the amplitude, the shape, or the duration of an applied pulse discussed herein may be varied and may be different for the various operations discussed in operating the memory die 200.

The local memory controller 245 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 245 in response to various access commands (e.g., from a host device 105). The local memory controller 245 may be operable to perform other access operations not listed here or other operations related to the operating of the memory die 200 that are not directly related to accessing the memory cells 205.

The local memory controller 245 may be operable to perform a write operation (e.g., a programming operation) on one or more memory cells 205 of the memory die 200 using the techniques described herein (e.g., using a normal write approach, a force write approach, or a combination thereof). During a write operation, a memory cell 205 of the memory die 200 may be programmed to store a desired logic state. The local memory controller 245 may identify a target memory cell 205 on which to perform the write operation. The local memory controller 245 may identify a target row line 210 and a target column line 215 coupled with the target memory cell 205 (e.g., the address of the target memory cell 205). The local memory controller 245 may activate the target row line 210 and the target column line 215 (e.g., apply one or more voltages to the row line 210 or column line 215 and thus one or more pulses to the target memory cell 205) to access the target memory cell 205. The local memory controller 245 may apply a specific signal (e.g., one or more pulses) to the column line 215 during the write operation to store a specific state in the storage element of the memory cell 205. A pulse used as part of the write operation may include one or more voltage levels over a duration.

The local memory controller 245 may be operable to perform a read operation (e.g., a sense operation) on one or more memory cells 205 of the memory die 200. During a read operation, the logic state stored in a memory cell 205 of the memory die 200 may be determined. The local memory controller 245 may identify a target memory cell 205 on which to perform the read operation. The local memory controller 245 may identify a target row line 210 and a target column line 215 coupled with the target memory cell 205 (e.g., the address of the target memory cell 205). The local memory controller 245 may activate the target row line 210 and the target column line 215 (e.g., apply one or more voltages to the row line 210 or column line 215 and thus one or more pulses to the target memory cell 205) to access the target memory cell 205. The sense component 230 may detect a signal received from the memory cell 205 that is based on the pulse applied to the row line 210, the pulse applied to the column line, and/or a resistance or threshold characteristic of the memory cell 205 (e.g., a signal indicative of whether the memory cell 205 exhibited a snapback event). The sense component 230 may amplify the signal. The local memory controller 245 may activate the sense component 230 (e.g., latch the sense component) and thereby compare the signal received from the memory cell 205 to the reference signal 235. Based on that comparison, the sense component 230 may determine a logic state that is stored by the memory cell 205. A pulse used as part of the read operation may include one or more voltage levels over a duration.

In some examples, the local memory controller 245 may perform a write operation utilizing a normal write approach, a force write approach, or a combination thereof. When using the normal write approach, the local memory controller 245 may activate the sense component 230 (or a portion thereof) while applying a first pulse to determine a logic state of a memory cell 205. The local memory controller 245 may then apply a second pulse to write the memory cell depending on the determined logic state. When using the force write approach, the local memory controller 245 may write to a memory cell irrespective of the logic state stored at the memory cell—in some such cases, the local memory controller may deactivate the sense component 230 (or a portion thereof) or may not latch one or more signals generated by the sense component 230 during a portion of the write operation (e.g., while a first pulse included in the force write operation is applied). In some examples, there may be performance tradeoffs between the normal write approach and force write approach, at least some of which may depend on a target logic state associated with the write operation. Thus, as described herein, the local memory controller 245 may in some examples implement a mixed approach—e.g., utilize the normal write approach for one logic state and the force write approach for another logic state. In other examples, local memory controller 245 may utilize the normal write approach first and then utilize the force write approach if the normal write approach is unsuccessful.

Figure 3:
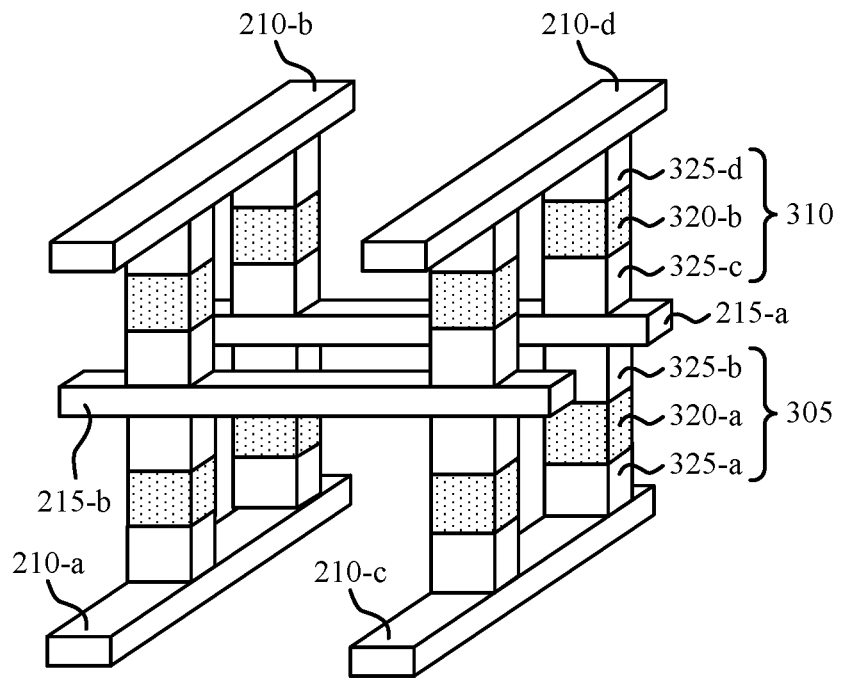
FIG. 3 illustrates an example of memory cells that support programming techniques for polarity-based memory cells in accordance with examples as disclosed herein.

FIG. 3 illustrates an example of a memory array 300 in accordance with examples as disclosed herein. Memory array 300 may be an example of portions of the memory arrays or memory dies described with reference to FIGS. 1 and 2. The memory array 300 may include a first deck 305 of memory cells that is positioned above a substrate (not shown) and a second deck 310 of memory cells on top of the first array or deck 305. Though the example of memory array 300 includes two decks 305, 310, the memory array 300 may include any quantity of decks (e.g., one or more than two).

Memory array 300 may also include a row line 210-a, a row line 210-b, a row line 210-c, a row line 210-d, a column line 215-a, and a column line 215-b, which may be examples of row lines 210 and column lines 215, as described with reference to FIG. 2. One or more memory cells of the first deck 305 and the second deck 310 may include one or more chalcogenide materials in a pillar between access lines. For example, a single stack between access lines may include one or more of a first electrode, a first chalcogenide material (e.g., selector component), a second electrode, a second chalcogenide material (e.g., storage element), or a third electrode. In some cases, as shown in the example of FIG. 3, a single stack may include a single chalcogenide element, which may be configured as a self-selecting storage component. Although some elements included in FIG. 3 are labeled with a numeric indicator, other corresponding elements are not labeled, although they are the same or would be understood to be similar, in an effort to increase visibility and clarity of the depicted features.

One or more memory cells of the first deck 305 may include one or more of an electrode 325-a, a storage element 320-a, or an electrode 325-b. One or more memory cells of the second deck 310 may include an electrode 325-c, a storage element 320-b, and an electrode 325-d. The storage elements 320 may be examples of a chalcogenide material, such as a thresholding storage element or a self-selecting storage element. The memory cells of the first deck 305 and second deck 310 may, in some examples, have common conductive lines such that corresponding memory cells of one or more decks 305 and one or more decks 310 may share column lines 215 or row lines 210. For example, the first electrode 325-c of the second deck 310 and the second electrode 325-b of the first deck 305 may be coupled with column line 215-a such that the column line 215-a may be shared by vertically adjacent memory cells.

In some examples, the material of the storage element 320 may include a chalcogenide material or other alloy including selenium (Se), tellurium (Te), arsenic (As), antimony (Sb), carbon (C), germanium (Ge), silicon (Si), or indium (IN), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide glass may include additional elements such as hydrogen (H), oxygen (O), nitrogen (N), chlorine (Cl), or fluorine (F), each in atomic or molecular forms.

In some examples, such as for thresholding memory cells or self-selecting memory cells, some or all of the set of logic states supported by the memory cells may be associated with a same state, such as an amorphous state of the chalcogenide material as opposed to a crystalline state of the chalcogenide material (e.g., the material in a single state may be operable to store different logic states). In some examples, the storage element 320 may be an example of a self-selecting memory cell. In such examples, the material used in the storage element 320 may be based on an alloy (such as the alloys listed above) and may be operated so as to undergo a state change during normal operation of the memory cell (e.g., due to ion migration or segregation within the storage element 320). For example, a self-selecting memory cell may have a high threshold voltage state and a low threshold voltage state. A high threshold voltage state may correspond to a first logic state (e.g., a reset state) and a low threshold voltage state may correspond to a second logic state (e.g., a set state).

During a programming (write) operation of a self-selecting memory cell (e.g., including electrode 325-a, storage element 320-a, and electrode 325-b), a polarity of one or more pulses used for a write operation may influence (determine, set, program) a particular behavior or characteristic of the material of the storage element 320, such as the threshold voltage of the material. The difference in threshold voltages of the material of the storage element 320 depending on the logic state stored by the material of the storage element 320 (e.g., the difference between the threshold voltage when the material is storing a logic state '0' versus a logic state '1') may correspond to the read window of the storage element 320.

The architecture of memory array 300 may be referred to as a cross-point architecture, in some examples, in which a memory cell is formed at a topological cross-point between a row line 210 and a column line 215. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selector element. For example, DRAM may use a transistor, which is a three-terminal device, as the selector element for each memory cell and may have a larger memory cell area compared to the cross-point architecture.

While the example of FIG. 3 shows two memory decks, other configurations are possible. In some examples, a single memory deck of memory cells may be constructed above a substrate, which may be referred to as a two-dimensional memory. In some examples, two or more decks of memory cells may be configured in a similar manner in a three-dimensional cross point architecture. Further, in some cases, elements shown in or described with reference to FIG. 3 may be electrically coupled with one another as shown or described but rearranged physically (e.g., a storage element 320 and possibly a selection element or electrode 325 may be electrically in series between a row line 210 and a column line 215 but need not be in a pillar or stack configuration).

In some examples, the memory cells in memory array 300 may be written (e.g., programmed) with a normal write approach. For example, a first pulse—which in some cases may be referred to as a pre-read pulse or alternatively as a drift cancellation pulse—may be applied to the memory cells, where the first pulse may be used to determine a logic state already stored by the memory cell, and the first pulse may also mitigate drift in the threshold voltage of the memory cell since the memory cell was previously programmed. A second pulse—which in some cases may be referred to as a program pulse—may or may not then be applied to a given memory cell, depending on whether the logic state already stored by the memory cell differs from a target logic state for the memory cell. In other examples, the memory cells may be written with a force write approach. For example, a program pulse may be applied to the memory cells irrespective of the logic states already stored by the memory cells, possible following a drift cancellation pulse. In other examples, a memory device may first attempt to write the memory cells in memory array 300 using the normal write approach first, then write the memory cells using the force write approach if the normal write approach is unsuccessful. In some examples, there may be performance tradeoffs between the normal write approach and the force write approach. Thus, as described herein, a memory device may use a mix of normal writes and force writes in order to leverage benefits associated with the different approaches while mitigating associated drawbacks.

Figure 4A:
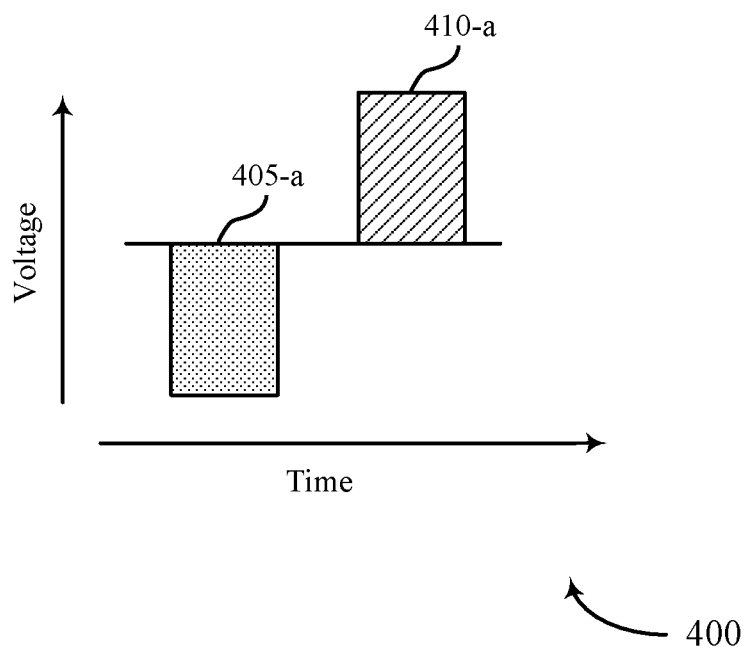
FIGS. 4A and 4B illustrate examples of plots that support programming techniques for polarity-based memory cells in accordance with examples as disclosed herein.
Figure 4B:
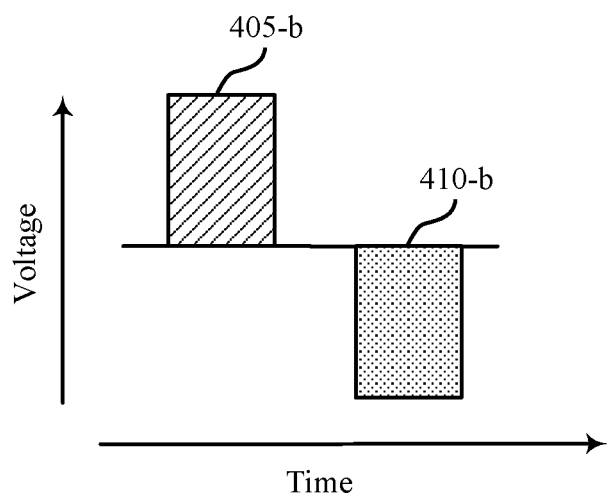

FIGS. 4A and 4B may illustrate plots of a write operations that support programming techniques for polarity-based memory cells in accordance with examples as disclosed herein. For example, FIG. 4A may illustrate a plot 400 of a write operation to write a memory cell (e.g., a memory cell 205 as described with reference to FIG. 2) to a reset state, and FIG. 4B may illustrate a plot 401 of a write operation to write a memory cell to a set state. The write operations depicted in FIGS. 4A and 4B may be performed by a system (e.g., system 100 as described with reference to FIG. 1). For example, a memory device (e.g., memory device 110 as described with reference to FIG. 1) may perform the write operations on memory cells in a memory array (e.g., memory array 170 as described with reference to FIG. 1, memory array 200 as described with reference to FIG. 2). The X-axis of the plots 400 and 401 may represent time and the Y-axis of the plots 400 and 401 may represent a voltage of an applied pulse to a given memory cell. Plot 400 may include a drift cancellation (DC) pulse 405-a and a program pulse 410-a, and plot 401 may include a DC pulse 405-b and a program pulse 410-b. As noted elsewhere, a DC pulse may in some cases alternatively be referred to as a pre-read pulse, as the same pulse may support drift mitigation as well as the identification of a currently stored logic state.

Referring to FIG. 4A, in some examples a memory device may receive a write command from a host device (e.g., host device 105 as described with reference to FIG. 1) to write one or more memory cells to a reset state. For example, the write command may indicate that the memory device is to write a first set of memory cells to the reset state and a second set of memory cells to the set state. In some cases, the memory device may utilize a normal write approach to achieve the reset state for the first set of memory cells.

When implementing the normal write approach, the memory device may check whether any memory cells in the set of memory cells subject to the write command already store the target logic state (e.g., are already in the reset state). The memory device may write a memory cell in the set of memory cells if the memory cell is identified as storing a logic state other than the target logic state associated with the write operation (e.g., the memory device may write a memory cell to the reset state if the memory cell is identified as previously being in a set state), and the memory device may refrain from writing a memory cell that is identified as already being in the target state (e.g., the memory device may refrain from writing a memory cell to the reset state if the memory cell is identified as already in the reset state, and thus may refrain from performing what may be referred to as a reset-on-reset write).

For example, when implementing a normal write approach, the memory device may first apply a DC pulse 405-a to each memory cell indicated by the write command to be placed into the reset state. In some examples, the DC pulse 405-a may mitigate drift in threshold voltage that may occur over time for a previously programmed memory cell. As one example, after being programmed to a given state, the threshold voltage of a memory cell may drift due to read operations performed on the memory cell, as read operations may tend to push (e.g., shift) the threshold voltage of the memory cell toward a state associated with the polarity of a pulse used as part of a read operation. Additionally or alternatively, the threshold voltage of a memory cell may drift due to access (e.g., read or write) operations performed on other (e.g., neighboring) memory cells in the same memory array, as pulses applied to other memory cells may cause voltage fluctuations for access lines within the array that may push (e.g., shift) the threshold voltage of the memory cell toward one state or another. Additionally or alternatively, the threshold voltage of a memory cell may drift due simply to the passage of time after the memory cell is programmed. Application of the DC pulse 405-a may be applied to mitigate the drift accumulated on the memory cell and revert the memory cell to its previously-written state before the drift occurred.

Additionally, the DC pulse 405-a may be used by the memory device to determine whether a memory cell is currently storing a logic state (e.g., the set state) different than the logic state associated with the write operation (e.g., the reset state). In some examples, such as when the memory cell comprises a chalcogenide material, as a voltage across the memory cell increases from zero to a value less than the threshold voltage of the memory cell, relatively little current may flow through the memory cell. That is, the memory cell may exhibit a relatively high resistance when the voltage across the memory cell is below the threshold voltage. When the voltage across the memory cells increases from a voltage less than the threshold voltage to a voltage greater than the threshold voltage, the current through the memory cell may increase rapidly. As the current through the memory cell increases, the voltage across the memory cell may decrease until the voltage reaches an intermediate voltage between zero and the threshold voltage. That is, the memory cell may exhibit a negative resistance until the voltage across the memory cell reaches the intermediate voltage, which may be referred to as a snapback event. After the voltage across the memory cell reaches the intermediate voltage, the memory cell may exhibit a positive resistance again and the voltage across the cell may again gradually increase past the threshold voltage.

Thus, the DC pulse 405-a may have a magnitude in between a nominal threshold voltage associated with the set state and a nominal threshold voltage associated with the reset state (e.g., higher than the nominal threshold voltage associated with the set state, lower than the nominal threshold voltage associated with the reset state) so that memory cells in the set state exhibit respective snapback events, but memory cells already in the reset state do not exhibit (e.g., experience, are detected as having) snapback events. Additionally, the DC pulse 405-a may be applied with an opposite polarity (e.g., a negative polarity) of the program pulse 410-a. In some cases, the observed threshold voltage of a memory cell may depend on the polarity of the voltage applied to the memory cell, and applying the DC pulse 405-a with the opposite polarity the program pulse 410-a may help ensure that memory cells in a set state exhibit snapback events and the memory cells in a reset state do not. Determining the state of a memory cell using a DC pulse 405 may also be referred to as a pre-read operation.

In some cases, the memory device may activate a snapback detection device, such as a sense component (e.g., sense component 230 as described with reference to FIG. 2) or a sense amplifier therein to detect whether a memory cell exhibits a snapback event while the DC pulse 405-a is applied. The snapback detection device may generate a signal indicative of whether the memory cell exhibits a snapback event, and a latch may latch (e.g., store) an indication of whether the memory cell exhibits a snapback event based on the signal generated by the snapback detection device, which may also indicate the respective state of the memory cell at the time the DC pulse 405-a is applied.

After applying the DC pulse 405-a to the set of memory cells to be written to the reset state, the memory device may apply a program pulse 410-a to those memory cells that exhibit snapback events in response to the DC pulse 405-a. That is, when utilizing the normal write approach, the memory device may refrain from applying the program pulse 410-a to memory cells that do not exhibit snapback events. In some examples, given a random distribution of logic states across a set of memory cells that are to be written to the reset state in response to a write command, utilizing the normal write approach may cause the memory device to apply the program pulse 410-a to half of the memory cells in the set—e.g., in a random distribution, half of the memory cells may already be storing the reset state. When performing the reset write operation, the program pulse 410-a may have a positive polarity. It is to be understood that any reference to positive and negative polarities herein is solely for the sake of clarity in discussion and is not limiting of the claims—one of ordinary skill in the art will appreciate that what polarity of a pulse is considered positive versus negative in a given implementation may be arbitrary.

In some examples, utilizing a normal write approach may save power and avoid additional wearout on memory cells relative to a force write approach (e.g., because the normal write approach may avoid applying the program pulse 410 to memory cells that are subject to a write command but already in a target state). That is, by reducing the quantity of times individual memory cells are written over a course of operation, the normal write approach may reduce wearout of memory cells. Additionally, reducing the quantity of times individual memory cells are written over a course of operation (e.g., by avoiding reset-on-reset writes) may avoid disturbances of non-target memory cells that may otherwise occur when other memory cells (e.g., neighbor memory cells) within a memory array are accessed, such as when unselected memory cells are coupled with the same access line as an accessed memory cell and the unselected memory cells experience a voltage across cell because they are coupled with the access line.

In some cases, however, a normal write approach may have one or more drawbacks. For example, a distribution of threshold voltages for memory cells storing one logic state may overlap with a distribution of threshold voltages for memory cells storing another logic state. That is, because of manufacturing and physical characteristic deviations, a threshold voltage of one memory cell storing a logic state may be different than a threshold voltage of another memory cell storing the same logic state. Thus, the memory cells within an array that each store a given logic state may be associated with a range or distribution of respective threshold voltages. When applying the DC pulse 405 utilizing a normal write approach, the DC pulse 405 may have to be between an uppermost threshold voltage of the distribution for a first logic state and below a bottommost threshold of the distribution for a second logic state in order to work optimally. For example, using FIG. 4A as an example, if the magnitude of the DC pulse 405-a is too small (e.g., below the uppermost threshold of the set state distribution), some memory cells in the set state may not snapback and thus will not be written to the reset state as commanded. But if the magnitude of the DC pulse 405-a is too large (e.g., above the lowermost threshold of the reset state distribution), some memory cells already in the reset state may snapback and thus may be unnecessarily written to the reset state again (e.g., some reset-on-reset writes may occur).

In some examples, the desirability of using a normal write approach may depend on the state to which a memory cell is to be written. For example, setting the magnitude of the DC pulse 405 to achieve a desired level of performance (e.g., to be above the uppermost threshold voltage for the distribution of one logic state and below the lowermost threshold voltage for the distribution of another logic state, or at least below an acceptable portion of the lowermost threshold voltage for the distribution of another logic state) may be feasible for one logic state by not another logic state. As one such example, in some cases the size of a read window for memory cells may depend on the polarity an applied read pulse, and thus configuring the magnitude of the DC pulse 405 to achieve a desired accuracy of pre-read operations may be more readily achieved for one polarity of DC pulse 405 than for another polarity of DC pulse 405. Accordingly, use of a normal write approach may be more beneficial or otherwise desirable for writing memory cells to a first state for which the opposite polarity DC pulse 405 provides a larger read window than for writing memory cells to a second state for which the opposite polarity DC pulse 405 provides a smaller read window.

Referring to FIG. 4B, as noted above, the write command may indicate that the memory device is to write a first set of memory cells to the reset state and a second set of memory cells to the set state. In some cases, the read window associated with a positive DC pulse 405-b in the context of writing a memory cell to the set state may be smaller than the read window associated with a negative DC pulse 405-a in the context of writing a memory cell to the reset state. Accordingly, in some examples, the memory device may utilize a force write approach to achieve the set state of the memory cells. The force write approach for the set state may be similar to the normal write approach described with reference to FIG. 4A for the reset state, but with pulses of opposite polarities and the program pulse 410-b applied regardless of whether a memory cell exhibits a snapback event in response to the DC pulse 405-b (e.g., set-on-set writes may occur). For example, the memory device may apply a DC pulse 405-b with a positive polarity to mitigate drift, and the memory device may then apply a negative polarity program pulse 410-b to all target memory cells to write them to the set state.

In some examples, when implementing the force write approach to write a memory cell to the set state, the memory device may refrain from detecting snapback events while applying the DC pulse 405-b. For example, the memory device may deactivate (or refrain from activating) the snapback detection device (e.g., sense component 230 or one or more sense amplifiers therein) to refrain from detecting snapback events that some memory cells subject to the DC pulse 405-b may exhibit. As another example, the memory device may refrain from latching signals generated by the snapback detection device (e.g., respective indications of the states of the memory cells subjected to the DC pulse 405-b).

Though certain examples may be described herein of using a normal write approach for cells to be written to the reset state and using a force write approach for cells to be written to the set state, it is to be understood that a given implementation may additionally or alternatively use a force write approach for cells to be written to the reset state, a normal write approach for cells to be written to the set state, or any combination thereof.

Figure 5A:
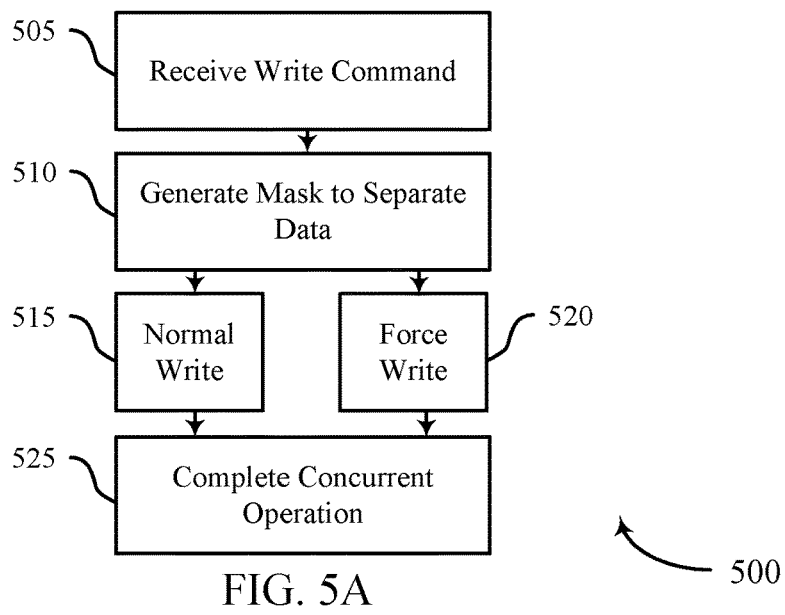
FIGS. 5A, 5B, and 5C illustrate examples of a process diagram and plots that support programming techniques for polarity-based memory cells in accordance with examples as disclosed herein.
Figure 5B:
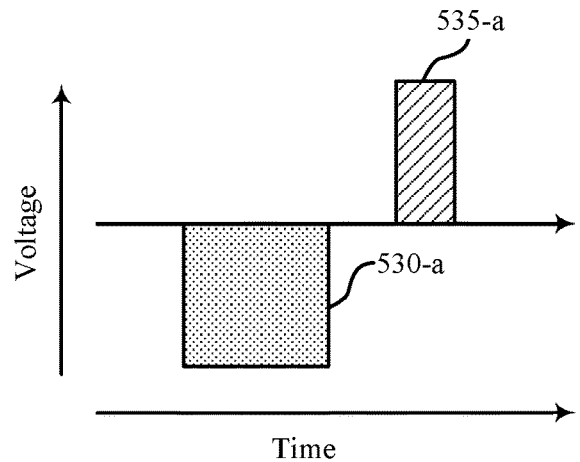
Figure 5C:
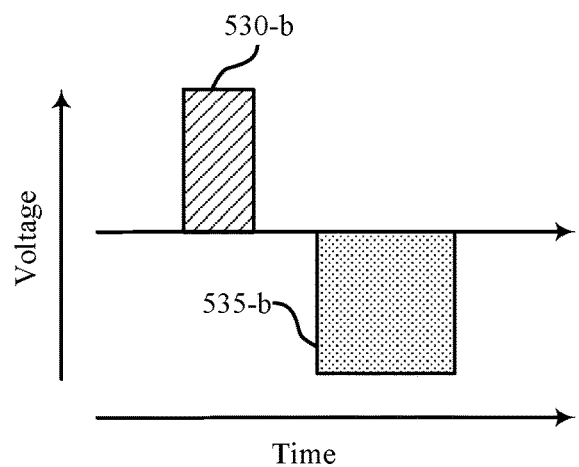

FIG. 5A may illustrate an example of a process diagram 500 that supports programming techniques for polarity-based memory cells in accordance with examples as disclosed herein. The operations of the process diagram may be implemented by a system or its components as described herein. For example, the process diagram 500 may be performed by or on a system or device as described with reference to FIGS. 1-3 (e.g., system 100, memory die 200, or memory array 300). Additionally, FIGS. 5B and 5C may illustrates plots of a write operation implemented in process diagram 500. For example, FIG. 5B may illustrate a plot 501 of a normal write approach to write memory cells (e.g., memory cells 205 as described with reference to FIG. 2) to a reset state utilizing pulses 530-a and 535-a. FIG. 5C may illustrate a plot 502 of a force write approach to write memory cells to a set state utilizing pulses 530-b and 535-b.

At 505, a memory device (e.g., memory device 110 as described with reference to FIG. 1) may receive a write command from a host device (e.g., host device 105 as described with reference to FIG. 1). In some examples, the write command may be associated with data that includes a mix of logic values, and thus may indicate to write a first set of memory cells in a memory array (e.g., memory array 170 as described with reference to FIG. 1) or a memory die (e.g., a memory die 160 as described with reference to FIG. 1) to a reset state and a second set of memory cells in the memory array or memory die to a set state. The data associated with the first set of memory cells may be referred to as reset data, and the data associated with the second set of memory cells may be referred to as set data.

At 510, the memory device may generate a mask to separate the reset data and the set data. That is, the mask generator may identify a first set of memory cells to write to a first logic state (e.g., the reset state) in response to the command received at 505 and a second set of memory cells to write to a second logic state in response to the command received at 505. In some cases, the mask generator may generate the masks such that the first set of memory cells are in a first set of one more tiles and the second set of memory cells are in a second set of one more tiles. A tile of memory cells may refer to a contiguous set of memory cells and may refer to the smallest set of memory cells in which independent access operations may be performed. For example, a first tile may include a first set of continuous row lines and a first set of continuous column lines, along with the memory cells coupled with those row lines and column lines. And a second tile may include a non-overlapping second set of continuous row lines and a non-overlapping second set of continuous column lines, along with the memory cells coupled with those row lines and column lines. Thus, access operations may be performed on one or more memory cells in the first tile concurrent with independent access operations being performed on one or more memory cells in the second tile, as the access lines in the two different tiles may be biased independent of one another. A memory array may include any quantity (e.g., one or more) of tiles.

At 515, the memory device may utilize a normal write approach to write the first set of memory cells to the reset state. Referring to FIG. 5B and plot 501, the memory device may apply a DC pulse 530-a (e.g., which may be an example of a DC pulse 405-a as described with reference to FIG. 4) to all memory cells in the first set, and the memory device may then apply a program pulse 535-a (e.g., which may be an example of a program pulse 410-a as described with reference to FIG. 4) to those memory cells in the first set that experience a snapback event in response to the DC pulse 530-a. In some examples, the DC pulse 530-a may have a duration larger than a duration of program pulse 535-a. For example, because the DC pulse 530-a is associated with snapback detection (e.g., is used as part of a pre-read operation) in the normal write approach, the DC pulse 530-a may be applied for a relatively long duration to help ensure that each memory cell in the untargeted logic state (e.g., set state) experiences a snapback event and is subsequently subjected to the program pulse 535-a. Additionally or alternatively, applying the DC pulse 530-a for the larger duration may improve read disturbance margins and reduce a range of threshold voltages associated with the first set of memory cells.

At 520, the memory device may utilize a force write approach to write the second set of memory cells to the set state. Referring to FIG. 5C and plot 502, the memory device may apply both a DC pulse 530-b (e.g., DC pulse 405-b as described with reference to FIG. 4) and then a program pulse 535-b (e.g., program pulse 410-b as described with reference to FIG. 4) to all memory cells in the second set. In some examples, the DC pulse 530-b may be applied for a duration smaller than a duration of program pulse 535-*b*. For example, because the DC pulse 530-*b* is not associated with snapback detection, the duration of the DC pulse 530-*b* may be reduced (but may still mitigate drift associated with the second set of memory cells). Additionally, because the DC pulse 530-*b* is not associated with snapback detection, the duration of the DC pulse 530-*b* may be smaller than the duration of the DC pulse 530-*a*. In some examples, the duration of the program pulse 535-*b* may be larger than the duration of program pulse 535-*a*. By applying the program pulse 535-*b* for a duration larger than the DC pulse 530-*b*, the memory device may improve the stability of the set state and reduce a range of threshold voltages associated with the second set of memory cells. Additionally or alternatively, the duration of DC pulse 530-*b* may be smaller than the duration of the DC pulse 530-*a*.

At 525, the memory device may perform the set write operation and the reset write operation. In some cases, the memory device may perform the set write operation and the reset write operation concurrently (e.g., during time periods that at least partially overlap). For example, although the duration of the DC pulse 530-*a* is different than the duration of the DC pulse 530-*b* and the duration of program pulse 535-*a* is different than the duration of the program pulse 535-*b*, the sum of the duration of the DC pulse 530-*a* and the duration of the program pulse 535-*a* may in some cases be equal to the sum of the duration of the DC pulse 530-*b* and the duration of the program pulse 535-*b*. Additionally or alternatively, a leading edge of the DC pulse 530-*a* may be aligned in time with the leading edge of the DC pulse 530-*b*, a trailing edge of the program pulse 535-*a* may be aligned in time with the trailing edge of the program pulse 535-*b*, or both. Thus, the first set of memory cells and the second set of memory cells may in some cases be written concurrently even when utilizing a mixed normal write and force write approach. Regardless of whether normal and force writes occur concurrently, configuring the normal write operation at 515 and the force write operation at 520 to have a common (equal) overall duration (e.g., write latency) may simplify various design aspects for a memory device and a system that includes the memory device, among other advantages that may be appreciated by one of ordinary skill in the art.

Figure 6:
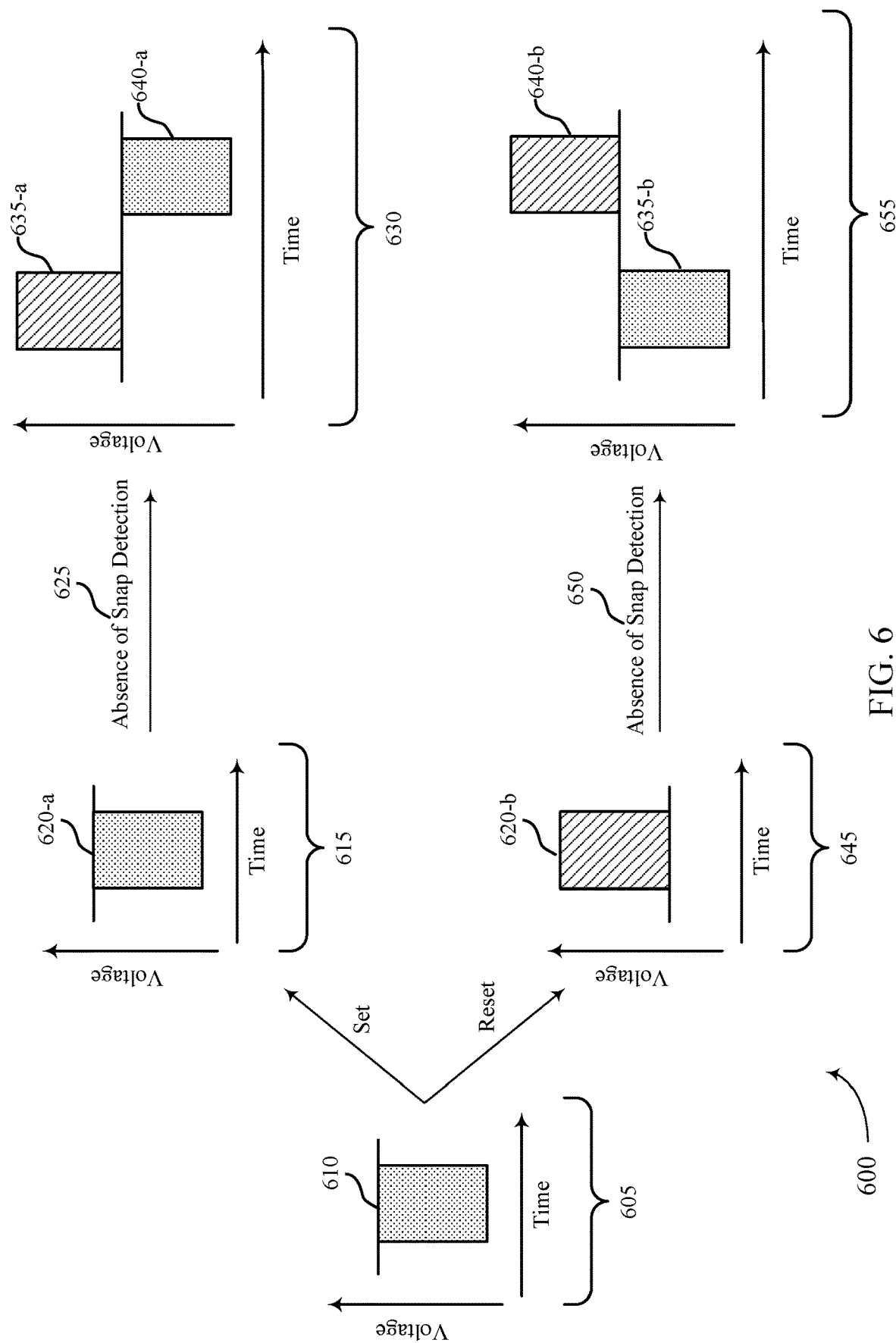
FIG. 6 illustrates an example of a process diagram that supports programming techniques for polarity-based memory cells in accordance with examples as disclosed herein.

FIG. 6 illustrates an example of a process diagram 600 of a write operation that supports programming techniques for polarity-based memory cells in accordance with examples as disclosed herein. The operations of the process diagram may be implemented by a system or its components as described herein. For example, the process diagram 500 may be performed by or on a system or device as described with reference to FIGS. 1-3 (e.g., system 100, memory die 200, or memory array 300). Process diagram 600 may be associated with utilizing a normal write approach on memory cells (e.g., memory cells 205) first and supplementing the normal write approach with a force write approach in cases where the normal write approach was unsuccessful.

At 605, a memory device (e.g., memory device 110 as described with reference to FIG. 1) may apply a pre-read pulse 610 (which may be an example of a DC pulse as described herein) having a negative polarity after receiving a write command from a host device (e.g., host device 105 as described with reference to FIG. 1). In some examples, the write command may include set data and reset data to write to memory cells in a memory array (e.g., memory array 170 as described with reference to FIG. 1) or a memory die (e.g., a memory die 160 as described with reference to FIG. 1). For example, the write command may indicate a first set of memory cells to write to a set state and a second set of memory cells to write to a reset state. And in some cases, the memory device may use a mask generator (e.g., a mask generator as described with reference to FIG. 5) to separate the set data and reset data to different tiles.

In some examples, the memory device may apply the pre-read pulse 610 to both the first set of memory cells (to be written to the set state) and the second set of memory cells (to be written to the reset state) concurrently. In some cases, the memory device may enable snapback detection (e.g., snapback detection as described with reference to FIG. 3) while applying the pre-read pulse 610 to determine which memory cells within the first set of memory cells and the second set of memory cells are not already in their respective target logic states. As the pre-read pulse 610 is negative (like DC pulse 405-*a* of FIG. 4), memory cells already storing the set state may experience a snapback event. For example, for the first set of memory cells (to be written to the set state), the memory device may utilize the pre-read pulse 610 to determine a first subset of memory cells in the first set of memory cells that currently store a reset state based on an absence of respective snapback events. In such examples, the memory device may proceed to 615 to write the first subset of memory cells to the set state in accordance with a normal write approach. Additionally, for the second set of memory cells (to be written to the reset state), the memory device may utilize the pre-read pulse 610 to determine a second subset of memory cells in the second set of memory cells that currently store a set state based on a respective snapback detection (e.g., the presence of respective snapback events). In such examples, the memory device may proceed to 645 to write the second subset of memory cells to the reset state in accordance with a normal write approach.

At 615, the memory device may apply a program pulse 620-*a* having a negative polarity to the first subset of memory cells identified at 605 as having a target state of set but being in the reset state, in order to write such memory cells to the set state. In some examples, the program pulse 620-*a* may also be associated with a snapback detection. That is, the memory device may activate snapback detection while applying the program pulse 620-*a*. In some examples, while applying the program pulse 620-*a*, some memory cells of the first subset of memory cells may experience a snapback event when written to the set state. That is, when a memory cell of the first subset is successfully programmed (e.g., written to the set state), the memory cell may experience a snapback event. Thus, the memory device may utilize the snapback detection to verify which memory cells in the first subset of memory cells to which program pulse 620-*a* is applied are successfully written to the set state.

At 625, the memory device may determine an absence of a snap detection for a third subset of one or more memory cells, which may be within the first subset of memory cells identified at 605 and thus the first set of memory cells to be written to the set state. That is, despite having been subjected to the program pulse 620-*a*, the third subset of memory cells may remain in the reset state (e.g., the memory device was unsuccessful in writing the third subset to the set state using program pulse 620-*a*). For example, a memory cell of the third subset of memory cells may remain in reset state as the program pulse 620-*a* did not exceed a threshold value of the memory cell. When the memory device determines an absence of a snapback event for one or more memory cells in response to program pulse 620-*a* (e.g., identifies the third subset of memory cells), the memory device may proceed to 630.

At 630, the memory device may utilize a force write approach to write the third subset of memory cells to the set state. For example, the memory device may apply a DC pulse 635-a (e.g., which may be an example of a DC pulse 405-b as described with reference to FIG. 4) having a positive polarity and then a program pulse 640-a (e.g., which may be an example of a program pulse 410-b as described with reference to FIG. 4) having a negative polarity to the second subset of memory cells in the first set. Utilizing the force write approach may successfully write the third subset of memory cells to the set state. Thus, to write the first set of memory cells to the set state, a memory device may use a normal write approach (applying pre-read pulse 610 to all memory cells in the first set followed by program pulse 620-a to those memory cells of the first set that are not already in the set state) and then a force write approach as necessary (applying DC pulse 635-a and program pulse 640-a to any memory cell of the first set that is identified as remaining in the reset state after the application of program pulse 620-a).

At 645-655, the memory device may utilize a process similar to 615-630 to write the second subset of memory cells in the second set to the reset state. For example, at 645, the memory device may apply a program pulse 620-b having a positive polarity to the second subset of memory cells. In some examples, the memory device may activate snapback detection while applying program pulse 620-b and detect a respective snapback event for a memory cell that is successfully programmed to the reset state.

At 650, the memory device may determine an absence of a snapback event for a fourth subset of one or more memory cells in the second set of memory cells. That is, after being applied with the program pulse 620-b, the fourth subset of memory cells may remain in the set state (e.g., the memory device was unsuccessful in writing the fourth subset to the reset state). When the memory device determines an absence of respective snapback events for the fourth subset of memory cells, it may proceed to block 655.

At 655, the memory device may utilize a force write approach to write the fourth subset of memory cells to the reset state. For example, the memory device may apply a DC pulse 635-b (e.g., which may be an example of a DC pulse 405-a as described with reference to FIG. 4) having a negative polarity and then a program pulse 640-b (e.g., which may be an example of a program pulse 410-a as described with reference to FIG. 4) having a positive polarity to write the fourth subset of memory cells to the reset state. Utilizing the force write approach may successfully write the fourth subset of memory cells to the reset state. Thus, to write the second set of memory cells to the reset state, a memory device may use a normal write approach (applying pre-read pulse 610 to all memory cells in the second set followed by program pulse 620-b to those memory cells of the second set that are not already in the reset state) and then a force write approach as necessary (applying DC pulse 635-b and program pulse 640-b to any memory cell of the second set that is identified as remaining in the set state after the application of program pulse 620-b).

In some examples, the program pulse 620-a and 620-b may be applied concurrently, the DC pulse 635-a and DC pulse 635-b may be applied concurrently, or the program pulse 640-a and 640-b may be applied concurrently, or any combination thereof.

Figure 7:
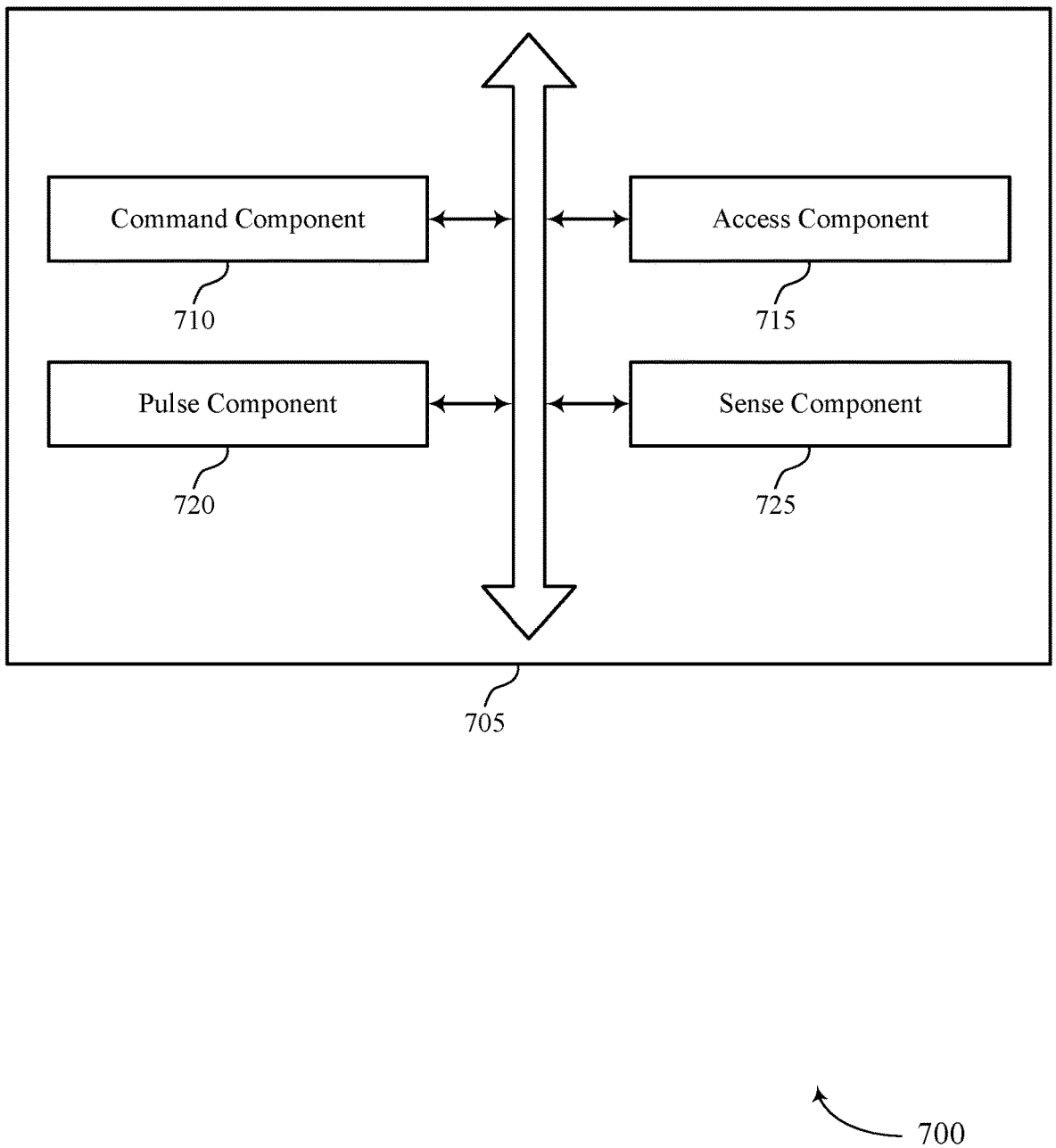
FIG. 7 shows a block diagram of a memory device that supports programming techniques for polarity-based memory cells in accordance with examples as disclosed herein.

FIG. 7 shows a block diagram 700 of a memory device 705 that supports programming techniques for polarity-based memory cells in accordance with examples as disclosed herein. The memory device 705 may be an example of aspects of a memory device as described with reference to FIGS. 1-6. The memory device 705 may include a command component 710, an access component 715, a pulse component 720, and a sense component 725. Each of these modules may communicate, directly or indirectly, with one another (e.g., via one or more buses).

In some examples, the command component 710 may receive, at a memory device, a command to write a first set of memory cells at the memory device to a first state and a second set of memory cells at the memory device to a second state. The access component 715 may perform a first write operation on the first set of memory cells based on the command. As part of performing the first write operation, the pulse component 720 may apply a first pulse having a first polarity to the first set of memory cells, the sense component 725 may identify, based on applying the first pulse and within the first set of memory cells, a subset of memory cells that are in the second state, and the pulse component 720 may apply, based on the identifying, a second pulse having a second polarity to the subset of memory cells to write the subset of memory cells to the first state. The access component 715 may perform, concurrent with the first write operation, a second write operation on the second set of memory cells based on the command. As part of performing the second write operation, the pulse component 720 may apply a third pulse having the second polarity to the second set of memory cells, and the pulse component 720 may apply, after applying third pulse, a fourth pulse having the first polarity to the second set of memory cells to write the second set of memory cells to the second state.

In some examples, as part of the first write operation, the sense component 725 may detect, based on the pulse component 720 applying the first pulse, respective snapback events for the subset of memory cells, where identifying the subset of memory cells that are in the second state is based on detecting the respective snapback events for the subset of memory cells.

In some examples, as part of the first write operation, the sense component 725 may detect, based on the pulse component 720 applying the first pulse, an absence of respective snapback events for a second subset of memory cells within the first set of memory cells. In some examples, the pulse component 720 may refrain from applying the second pulse to the second subset of memory cells based on the absence of the respective snapback events for the second subset of memory cells.

In some examples, performing the first write operation further includes the sense component 725 activating a first sense component for one or more of the first set of memory cells, the identifying based on activating the first sense component. In some examples, performing the second write operation further includes the sense component 725 deactivating or maintaining as deactivated a second sense component for one or more of the second set of memory cells.

In some examples, performing the first write operation further includes the sense component 725 latching, based on applying the first pulse, respective indications of respective states of the first set of memory cells, the identifying based on the latching. In some examples, performing the second write operation includes the sense component 725 refraining from latching respective indications of respective states of the second set of memory cells.

In some examples, the first polarity may be a negative polarity and the second polarity may be a positive polarity.

In some examples, the pulse component 720 may apply the first pulse for a first duration. In some examples, the pulse component 720 may apply the second pulse for a second duration that is smaller than the first duration.

In some examples, the pulse component 720 may apply the third pulse for a third duration. In some examples, the pulse component 720 may apply the fourth pulse for a fourth duration that is larger than the third duration.

In some examples, the pulse component 720 may apply the first pulse for a first duration. In some examples, the pulse component 720 may apply the third pulse for a third duration that is smaller than the first duration.

In some examples, the pulse component 720 may apply the second pulse for a second duration. In some examples, the pulse component 720 may apply the fourth pulse for a fourth duration that is larger than the second duration.

In some examples, the pulse component 720 may apply the first pulse for a first duration and the second pulse for a second duration. In some examples, the pulse component 720 may apply the third pulse for a third duration and the fourth pulse for a fourth duration, where a sum of the first duration and second duration is equal to a sum of the third duration and fourth duration.

In some examples, the pulse component 720 may apply the first pulse to mitigate drift in threshold voltages associated with the first set of memory cells. In some examples, the pulse component 720 may apply the third pulse to mitigate drift in threshold voltages associated with the second set of memory cells.

In some examples, the command component 710 may receive, at a memory device, a write command to write a first set of memory cells at the memory device to a first state. The pulse component 720 may apply, based on the command, a first pulse having a first polarity to the first set of memory cells. The sense component 725 may identify, based on the pulse component 720 applying the first pulse and within the first set of memory cells, a first subset of memory cells that are in a second state. The pulse component 720 may apply a second pulse having the first polarity to the first subset of memory cells based on the sense component 725 identifying the first subset of memory cells. The sense component 725 may identify, based on the pulse component 720 applying the second pulse and within the first subset of memory cells, a second subset of memory cells that remain in the second state. The pulse component 720 may apply a third pulse having a second polarity to the second subset of memory cells based on the sense component 725 identifying the second subset of memory cells. The pulse component 720 may apply, after applying the third pulse, a fourth pulse having the first polarity to the second subset of memory cells to write the second subset of memory cells to the first state.

In some examples, the command may be further to write a second set of memory cells at the memory device to the second state. The pulse component 720 may apply, based on the command, the first pulse to the second set of memory cells. The sense component 725 may identify, based on the pulse component 720 applying the first pulse and within the second set of memory cells, a third subset of the set of memory cells that are in the first state. The pulse component 720 may apply a fifth pulse having the second polarity to the third subset of memory cells based on the sense component 725 identifying the third subset of memory cells. The sense component 725 may identify, based on the pulse component 720 applying the fifth pulse and within the third subset of memory cells, a fourth subset of memory cells that remain in the first state. The pulse component 720 may apply a sixth pulse having the first polarity to the fourth subset of memory cells based on the sense component 725 identifying the fourth subset of memory cells. The pulse component 720 may apply, after applying the sixth pulse, a seventh pulse having the second polarity to the fourth subset of memory cells to write the fourth subset of memory cells to the second state.

In some cases, the pulse component 720 may apply the second pulse and the fifth pulse concurrently, the third pulse and the sixth pulse concurrently, or the fourth pulse and the seventh pulse concurrently, or any combination thereof.

In some examples, the sense component 725 may detect, based on the pulse component 720 applying the first pulse, an absence of respective snapback events for the first subset of memory cells, where identifying the first subset of memory cells that are in the second state is based on the detecting the absence of the respective snapback events for the first subset of memory cells.

In some examples, the sense component 725 may detect, based on the pulse component 720 applying the first pulse, respective snapback events for the third subset of memory cells, where identifying the third subset of memory cells that are in the first state is based on the detecting the respective snapback events for the third subset of memory cells.

In some examples, the sense component 725 may detect, based on the pulse component 720 applying the second pulse, an absence of respective snapback events for the second subset of memory cells, where identifying the second subset of memory cells that remain in the second state is based on the detecting the absence of the respective snapback events for the third subset of memory cells.

In some examples, the sense component 725 may detect, based on the pulse component 720 applying the fifth pulse, an absence of respective snapback events for the fourth subset of memory cells, where identifying the fourth subset of memory cells that remain in the second state is based on the detecting the absence of the respective snapback events for the first subset of memory cells.

Figure 8:
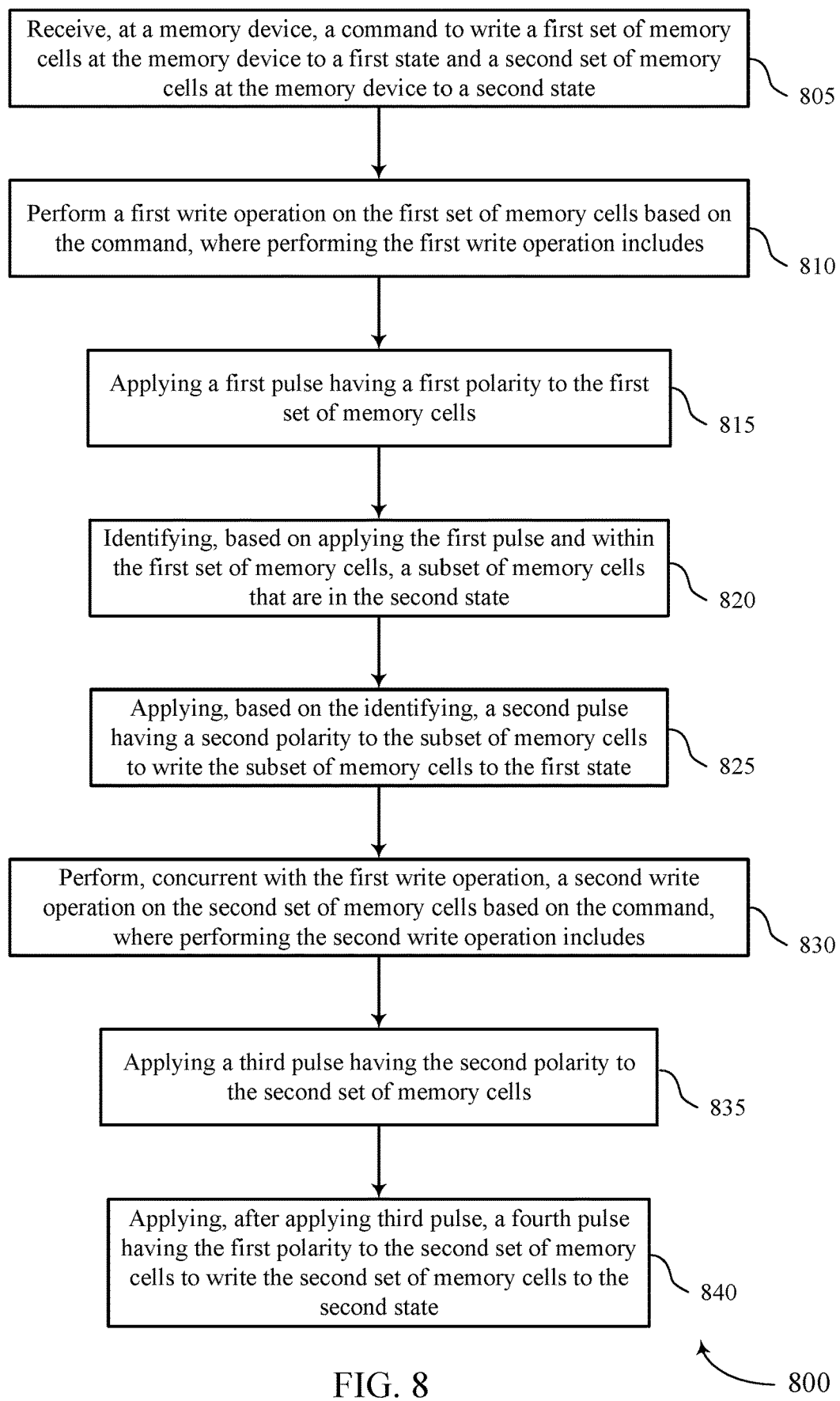
FIGS. 8 and 9 show flowcharts illustrating a method or methods that support programming techniques for polarity-based memory cells in accordance with examples as disclosed herein.

FIG. 8 shows a flowchart illustrating a method or methods 800 that supports programming techniques for polarity-based memory cells in accordance with aspects of the present disclosure. The operations of method 800 may be implemented by a memory device or its components as described herein. For example, the operations of method 800 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 805, the memory device may receive, at a memory device, a command to write a first set of memory cells at the memory device to a first state and a second set of memory cells at the memory device to a second state. The operations of 805 may be performed according to the methods described herein. In some examples, aspects of the operations of 805 may be performed by a command component as described with reference to FIG. 7.

At 810, the memory device may perform a first write operation on the first set of memory cells based on the command. The operations of 810 may be performed according to the methods described herein. In some examples, aspects of the operations of 810 may be performed by an access component as described with reference to FIG. 7.

At 815, the memory device may, as part of the first write operation, apply a first pulse having a first polarity to the first set of memory cells. The operations of 815 may be performed according to the methods described herein. In some examples, aspects of the operations of 815 may be performed by a pulse component as described with reference to FIG. 7.

At 820, the memory device may, as part of the first write operation, identify, based on applying the first pulse and within the first set of memory cells, a subset of memory cells that are in the second state. The operations of 820 may be performed according to the methods described herein. In some examples, aspects of the operations of 820 may be performed by a sense component as described with reference to FIG. 7.

At 825, the memory device may, as part of the first write operation, apply, based on the identifying, a second pulse having a second polarity to the subset of memory cells to write the subset of memory cells to the first state. The operations of 825 may be performed according to the methods described herein. In some examples, aspects of the operations of 825 may be performed by a pulse component as described with reference to FIG. 7.

At 830, the memory device may perform, concurrent with the first write operation, a second write operation on the second set of memory cells based on the command. The operations of 830 may be performed according to the methods described herein. In some examples, aspects of the operations of 830 may be performed by an access component as described with reference to FIG. 7.

At 835, the memory device may, as part of the second write operation, apply a third pulse having the second polarity to the second set of memory cells. The operations of 835 may be performed according to the methods described herein. In some examples, aspects of the operations of 835 may be performed by a pulse component as described with reference to FIG. 7.

At 840, the memory device may, as part of the second write operation, apply, after applying third pulse, a fourth pulse having the first polarity to the second set of memory cells to write the second set of memory cells to the second state. The operations of 840 may be performed according to the methods described herein. In some examples, aspects of the operations of 840 may be performed by a pulse component as described with reference to FIG. 7.

In some examples, an apparatus as described herein may perform a method or methods, such as the method 800. The apparatus may include features, means, or instructions (e.g., a non-transitory computer-readable medium storing instructions executable by a processor) for receiving, at a memory device, a command to write a first set of memory cells at the memory device to a first state and a second set of memory cells at the memory device to a second state. The apparatus may further include features, means, or instructions for performing a first write operation on the first set of memory cells based on the command, where performing the first write operation includes applying a first pulse having a first polarity to the first set of memory cells, identifying, based on applying the first pulse and within the first set of memory cells, a subset of memory cells that are in the second state, and applying, based on the identifying, a second pulse having a second polarity to the subset of memory cells to write the subset of memory cells to the first state. The apparatus may further include features, means, or instructions for performing, concurrent with the first write operation, a second write operation on the second set of memory cells based on the command, where performing the second write operation includes applying a third pulse having the second polarity to the second set of memory cells and applying, after applying third pulse, a fourth pulse having the first polarity to the second set of memory cells to write the second set of memory cells to the second state.

In some examples of the method 800 and the apparatus described herein, operations, features, means, or instructions for performing the first write operation further may include operations, features, means, or instructions for detecting, based on applying the first pulse, respective snapback events for the subset of memory cells, where identifying the subset of memory cells that may be in the second state may be based on detecting the respective snapback events for the subset of memory cells.

In some examples of the method 800 and the apparatus described herein, operations, features, means, or instructions for performing the first write operation further may include operations, features, means, or instructions for detecting, based on applying the first pulse, an absence of respective snapback events for a second subset of memory cells within the first set of memory cells, and refraining from applying the second pulse to the second subset of memory cells based on the absence of the respective snapback events for the second subset of memory cells.

In some examples of the method 800 and the apparatus described herein, operations, features, means, or instructions for performing the first write operation further may include operations, features, means, or instructions for activating a first sense component for one or more of the first set of memory cells, the identifying based on activating the first sense component, and operations, features, means, or instructions for performing the second write operation further may include operations, features, means, or instructions for deactivating or maintaining as deactivated a second sense component for one or more of the second set of memory cells.

In some examples of the method 800 and the apparatus described herein, operations, features, means, or instructions for performing the first write operation further may include operations, features, means, or instructions for latching, based on applying the first pulse, respective indications of respective states of the first set of memory cells, the identifying based on the latching, and operations, features, means, or instructions for performing the second write operation may include operations, features, means, or instructions for refraining from latching respective indications of respective states of the second set of memory cells.

In some examples of the method 800 and the apparatus described herein, the first polarity may be a negative polarity and the second polarity may be a positive polarity.

In some examples of the method 800 and the apparatus described herein, the first pulse may be applied for a first duration, and the second pulse may be applied for a second duration that may be smaller than the first duration.

In some examples of the method 800 and the apparatus described herein, the third pulse may be applied for a third duration, and the fourth pulse may be applied for a fourth duration that may be larger than the third duration.

In some examples of the method 800 and the apparatus described herein, the first pulse may be applied for a first duration, and the third pulse may be applied for a third duration that may be smaller than the first duration.

In some examples of the method 800 and the apparatus described herein, the second pulse may be applied for a second duration, and the fourth pulse may be applied for a fourth duration that may be larger than the second duration.

In some examples of the method 800 and the apparatus described herein, the first pulse may be applied for a first duration and the second pulse may be applied for a second duration, and the third pulse may be applied for a third duration and the fourth pulse may be applied for a fourth duration, where a sum of the first duration and second duration may be equal to a sum of the third duration and fourth duration.

In some examples of the method 800 and the apparatus described herein, the first pulse may be configured to mitigate drift in threshold voltages associated with the first set of memory cells, and the third pulse may be configured to mitigate drift in threshold voltages associated with the second set of memory cells.

Figure 9:
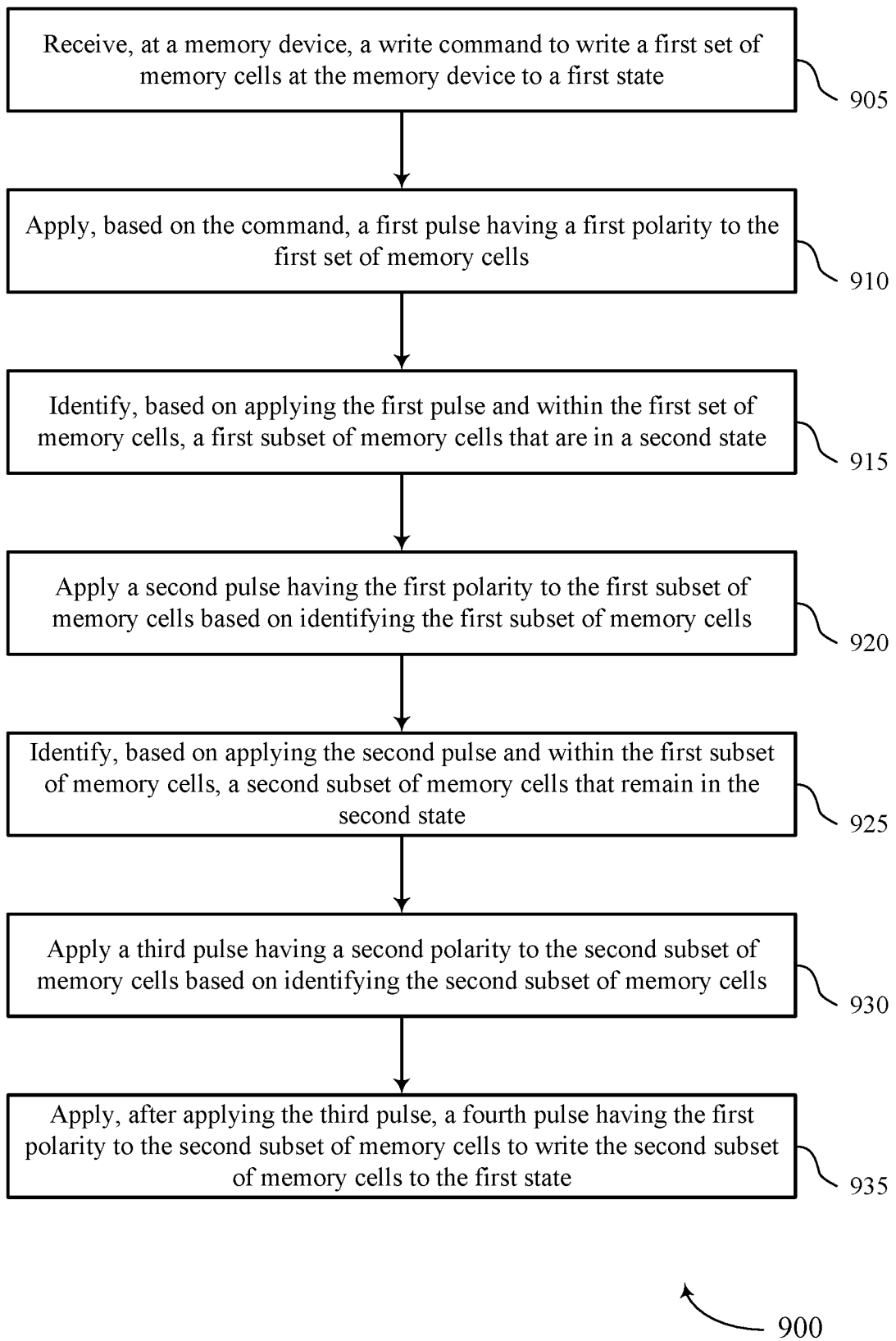

FIG. 9 shows a flowchart illustrating a method or methods 900 that supports programming techniques for polarity-based memory cells in accordance with aspects of the present disclosure. The operations of method 900 may be implemented by a memory device or its components as described herein. For example, the operations of method 900 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 905, the memory device may receive, at a memory device, a write command to write a first set of memory cells at the memory device to a first state. The operations of 905 may be performed according to the methods described herein. In some examples, aspects of the operations of 905 may be performed by a command component as described with reference to FIG. 7.

At 910, the memory device may apply, based on the command, a first pulse having a first polarity to the first set of memory cells. The operations of 910 may be performed according to the methods described herein. In some examples, aspects of the operations of 910 may be performed by a pulse component as described with reference to FIG. 7.

At 915, the memory device may identify, based on applying the first pulse and within the first set of memory cells, a first subset of memory cells that are in a second state. The operations of 915 may be performed according to the methods described herein. In some examples, aspects of the operations of 915 may be performed by a sense component as described with reference to FIG. 7.

At 920, the memory device may apply a second pulse having the first polarity to the first subset of memory cells based on identifying the first subset of memory cells. The operations of 920 may be performed according to the methods described herein. In some examples, aspects of the operations of 920 may be performed by a pulse component as described with reference to FIG. 7.

At 925, the memory device may identify, based on applying the second pulse and within the first subset of memory cells, a second subset of memory cells that remain in the second state. The operations of 925 may be performed according to the methods described herein. In some examples, aspects of the operations of 925 may be performed by a sense component as described with reference to FIG. 7.

At 930, the memory device may apply a third pulse having a second polarity to the second subset of memory cells based on identifying the second subset of memory cells. The operations of 930 may be performed according to the methods described herein. In some examples, aspects of the operations of 930 may be performed by a pulse component as described with reference to FIG. 7.

At 935, the memory device may apply, after applying the third pulse, a fourth pulse having the first polarity to the second subset of memory cells to write the second subset of memory cells to the first state. The operations of 935 may be performed according to the methods described herein. In some examples, aspects of the operations of 935 may be performed by a pulse component as described with reference to FIG. 7.

In some examples, an apparatus as described herein may perform a method or methods, such as the method 900. The apparatus may include features, means, or instructions (e.g., a non-transitory computer-readable medium storing instructions executable by a processor) for receiving, at a memory device, a write command to write a first set of memory cells at the memory device to a first state, applying, based on the command, a first pulse having a first polarity to the first set of memory cells, identifying, based on applying the first pulse and within the first set of memory cells, a first subset of memory cells that are in a second state, applying a second pulse having the first polarity to the first subset of memory cells based on identifying the first subset of memory cells, identifying, based on applying the second pulse and within the first subset of memory cells, a second subset of memory cells that remain in the second state, applying a third pulse having a second polarity to the second subset of memory cells based on identifying the second subset of memory cells, and applying, after applying the third pulse, a fourth pulse having the first polarity to the second subset of memory cells to write the second subset of memory cells to the first state.

Some examples of the method 900 and the apparatus described herein may further include operations, features, means, or instructions for, where the command is further to write a second set of memory cells at the memory device to the second state, applying, based on the command, the first pulse to the second set of memory cells, identifying, based on applying the first pulse and within the second set of memory cells, a third subset of the set of memory cells that may be in the first state, applying a fifth pulse having the second polarity to the third subset of memory cells based on identifying the third subset of memory cells, identifying, based on applying the fifth pulse and within the third subset of memory cells, a fourth subset of memory cells that remain in the first state, applying a sixth pulse having the first polarity to the fourth subset of memory cells based on identifying the fourth subset of memory cells, and applying, after applying the sixth pulse, a seventh pulse having the second polarity to the fourth subset of memory cells to write the fourth subset of memory cells to the second state.

In some examples of the method 900 and the apparatus described herein, the second pulse and the fifth pulse may be applied concurrently, the third pulse and the sixth pulse may be applied concurrently, or the fourth pulse and the seventh pulse may be applied concurrently, or any combination thereof.

Some examples of the method 900 and the apparatus described herein may further include operations, features, means, or instructions for detecting, based on applying the first pulse, an absence of respective snapback events for the first subset of memory cells, where identifying the first subset of memory cells that may be in the second state may be based on the detecting the absence of the respective snapback events for the first subset of memory cells, detecting, based on applying the first pulse, respective snapback events for the third subset of memory cells, where identifying the third subset of memory cells that may be in the first state may be based on the detecting the respective snapback events for the third subset of memory cells, detecting, based on applying the second pulse, an absence of respective snapback events for the second subset of memory cells, where identifying the second subset of memory cells that remain in the second state may be based on the detecting the absence of the respective snapback events for the third subset of memory cells, and detecting, based on applying the fifth pulse, an absence of respective snapback events for the fourth subset of memory cells, where identifying the fourth subset of memory cells that remain in the second state may be based on the detecting the absence of the respective snapback events for the first subset of memory cells.

It should be noted that the methods described herein describe possible implementations, and that the operations and the steps may be rearranged or otherwise modified and that other implementations are possible. Furthermore, portions from two or more of the methods may be combined.

An apparatus is described. The apparatus may include a memory array and a controller coupled with the memory array and configured to cause the apparatus to receive a command to write a first set of memory cells within the memory array to a first state and a second set of memory cells within the memory array to a second state. The controller may be further configured to cause the apparatus to perform a first write operation on the first set of memory cells based on the command, where, to perform the first write operation, the controller is configured to cause the apparatus to apply a first pulse having a first polarity to the first set of memory cells, identify, based on applying the first pulse and within the first set of memory cells, a subset of memory cells that are in the second state, and apply, based on the identifying the subset of memory cells, a second pulse having a second polarity to the subset of memory cells to write the subset of memory cells to the first state. The controller may be further configured to cause the apparatus to perform, concurrent with the first write operation, a second write operation on the second set of memory cells based on the command, where, to perform the second write operation, the controller is configured to cause the apparatus to, apply a third pulse having the second polarity to the second set of memory cells, and apply, after applying third pulse, a fourth pulse having the first polarity to the second set of memory cells to write the second set of memory cells to the second state.

In some cases, to perform the first write operation, the controller may be further configured to cause the apparatus to detect, based on applying the first pulse, respective snapback events for the subset of memory cells, where identifying the subset of memory cells that may be in the second state may be based on the respective snapback events for the subset of memory cells.

In some instances, to perform the first write operation, the controller may be further configured to cause the apparatus to detect, based on applying the first pulse, an absence of respective snapback events for a second subset of memory cells within the first set of memory cells, where refraining from applying the second pulse to the second subset of memory cells based on the absence of the respective snapback events for the second subset of memory cells.

Some examples of the apparatus may include a first sense component configured to sense one or more respective states of one or more of the first set of memory cells, where, to perform the first write operation, the controller may be further configured to cause the apparatus to activate the first sense component, the identifying based on activating the first sense component, and a second sense component configured to sense one or more respective states of one or more of the second set of memory cells, where, to perform the second write operation, the controller may be further configured to cause the apparatus to deactivate or maintain as deactivated the second sense component.

Some examples of the apparatus may include a first set of latches configured to latch respective states of the first set of memory cells, where, to perform the first write operation, the controller may be further configured to cause the apparatus to latch indications of the respective states of the first set of memory cells, the identifying based on the latching, and a second set of latches configured to latch respective states of the second set of memory cells, where, to perform the second write operation, the controller may be further configured to cause the apparatus to refrain from latching indications of the respective states of the second set of memory cells.

In some cases, the controller may be further configured to cause the apparatus to apply the first pulse for a first duration, apply the second pulse for a second duration that may be smaller than the second duration, apply the third pulse for a third duration, and apply the fourth pulse for a fourth duration that may be larger than the third duration.

In some instances, the controller may be further configured to cause the apparatus to apply the first pulse for a first duration, apply the third pulse for a third duration that may be smaller than the first duration, apply the second pulse for a second duration, and apply the fourth pulse for a fourth duration that may be larger than the second duration.

In some cases, the first set of memory cells may be in a first portion of a memory array including a first set of word lines and bit lines, and the second set of memory cells may be in a second portion of the memory array including a second set of word lines and bit lines different from the first set of word lines and bit lines.

An apparatus is described. The apparatus may include a memory array and a controller coupled with the memory array and configured to cause the apparatus to receive a command to write a first set of memory cells within the memory array to a first state and a second set of memory cells within the memory array to a second state, apply, based on the write command, a first pulse having a first polarity to the first set of memory cells and the second set of memory cells, apply a second pulse having the first polarity to a first subset of memory cells within the first set of memory cells, the first subset of memory cells identified as being in the second state based on the first pulse, apply a third pulse having a second polarity to a second subset of memory cells within the second set of memory cells, the second subset of memory cells identified as being in the first state based on the first pulse, apply a fourth pulse having the second polarity to a third subset of memory cells within the first set of memory cells, the third subset of memory cells identified as remaining in the second state based on the second pulse, apply a fifth pulse having the first polarity to a fourth subset of memory cells within the second set of memory cells, the fourth subset of memory cells identified as remaining in the first state based on the third pulse, apply, after the fourth pulse, a sixth pulse having the first polarity to the third subset of memory cells to write the third subset of memory cells to the first state, and apply, after the fifth pulse, a seventh pulse having the second polarity to the fourth subset of memory cells to write the fourth subset of memory cells to the second state.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, and/or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, the method comprising:
    receiving, at a memory device, a command to write a first set of memory cells at the memory device to a first state and a second set of memory cells at the memory device to a second state; and
    performing a first write operation on the first set of memory cells based at least in part on the command, wherein performing the first write operation comprises:
        applying a first pulse having a first polarity to the first set of memory cells;
        identifying, based at least in part on applying the first pulse and within the first set of memory cells, a subset of memory cells that are in the second state; and
        applying, based at least in part on the identifying, a second pulse having a second polarity to the subset of memory cells to write the subset of memory cells to the first state;
    performing, concurrent with the first write operation, a second write operation on the second set of memory cells based at least in part on the command, wherein performing the second write operation comprises:
        applying a third pulse having the second polarity to the second set of memory cells; and
        applying, after applying third pulse, a fourth pulse having the first polarity to the second set of memory cells to write the second set of memory cells to the second state.

2. The method of claim 1, wherein performing the first write operation further comprises:
    detecting, based at least in part on applying the first pulse, respective snapback events for the subset of memory cells, wherein identifying the subset of memory cells that are in the second state is based at least in part on detecting the respective snapback events for the subset of memory cells.

3. The method of claim 2, wherein performing the first write operation further comprises:
    detecting, based at least in part on applying the first pulse, an absence of respective snapback events for a second subset of memory cells within the first set of memory cells; and
    refraining from applying the second pulse to the second subset of memory cells based at least in part on the absence of the respective snapback events for the second subset of memory cells.

4. The method of claim 1, wherein:
    performing the first write operation further comprises activating a first sense component for one or more of the first set of memory cells, the identifying based at least in part on activating the first sense component; and
    performing the second write operation further comprises deactivating or maintaining as deactivated a second sense component for one or more of the second set of memory cells.

5. The method of claim 1, wherein:
    performing the first write operation further comprises latching, based at least in part on applying the first pulse, respective indications of respective states of the first set of memory cells, the identifying based at least in part on the latching; and performing the second write operation comprises refraining from latching respective indications of respective states of the second set of memory cells.

6. The method of claim 1, wherein the first polarity comprises a negative polarity and the second polarity comprises a positive polarity.

7. The method of claim 1, wherein:
the first pulse is applied for a first duration; and
the second pulse is applied for a second duration that is smaller than the first duration.

8. The method of claim 1, wherein:
the third pulse is applied for a third duration; and
the fourth pulse is applied for a fourth duration that is larger than the third duration.

9. The method of claim 1, wherein:
the first pulse is applied for a first duration; and
the third pulse is applied for a third duration that is smaller than the first duration.

10. The method of claim 1, wherein:
the second pulse is applied for a second duration; and
the fourth pulse is applied for a fourth duration that is larger than the second duration.

11. The method of claim 1, wherein:
the first pulse is applied for a first duration and the second pulse is applied for a second duration; and
the third pulse is applied for a third duration and the fourth pulse is applied for a fourth duration, wherein a sum of the first duration and second duration is equal to a sum of the third duration and fourth duration.

12. The method of claim 1, wherein:
the first pulse is configured to mitigate drift in threshold voltages associated with the first set of memory cells; and
the third pulse is configured to mitigate drift in threshold voltages associated with the second set of memory cells.

13. A method, the method comprising:
receiving, at a memory device, a write command to write a first set of memory cells at the memory device to a first state;
applying, based at least in part on the write command, a first pulse having a first polarity to the first set of memory cells;
identifying, based at least in part on applying the first pulse and within the first set of memory cells, a first subset of memory cells that are in a second state;
applying a second pulse having the first polarity to the first subset of memory cells based at least in part on identifying the first subset of memory cells;
identifying, based at least in part on applying the second pulse and within the first subset of memory cells, a second subset of memory cells that remain in the second state;
applying a third pulse having a second polarity to the second subset of memory cells based at least in part on identifying the second subset of memory cells; and
applying, after applying the third pulse, a fourth pulse having the first polarity to the second subset of memory cells to write the second subset of memory cells to the first state.

14. The method of claim 13, wherein the write command is further to write a second set of memory cells at the memory device to the second state, the method further comprising:
applying, based at least in part on the write command, the first pulse to the second set of memory cells;
identifying, based at least in part on applying the first pulse and within the second set of memory cells, a third subset of the second set of memory cells that are in the first state;
applying a fifth pulse having the second polarity to the third subset of memory cells based at least in part on identifying the third subset of memory cells;
identifying, based at least in part on applying the fifth pulse and within the third subset of memory cells, a fourth subset of memory cells that remain in the first state;
applying a sixth pulse having the first polarity to the fourth subset of memory cells based at least in part on identifying the fourth subset of memory cells; and
applying, after applying the sixth pulse, a seventh pulse having the second polarity to the fourth subset of memory cells to write the fourth subset of memory cells to the second state.

15. The method of claim 14, wherein the second pulse and the fifth pulse are applied concurrently, the third pulse and the sixth pulse are applied concurrently, or the fourth pulse and the seventh pulse are applied concurrently, or any combination thereof.

16. The method of claim 14, further comprising:
detecting, based at least in part on applying the first pulse, an absence of respective snapback events for the first subset of memory cells, wherein identifying the first subset of memory cells that are in the second state is based at least in part on the detecting the absence of the respective snapback events for the first subset of memory cells;
detecting, based at least in part on applying the first pulse, respective snapback events for the third subset of memory cells, wherein identifying the third subset of memory cells that are in the first state is based at least in part on the detecting the respective snapback events for the third subset of memory cells;
detecting, based at least in part on applying the second pulse, an absence of respective snapback events for the second subset of memory cells, wherein identifying the second subset of memory cells that remain in the second state is based at least in part on the detecting the absence of the respective snapback events for the third subset of memory cells; and
detecting, based at least in part on applying the fifth pulse, an absence of respective snapback events for the fourth subset of memory cells, wherein identifying the fourth subset of memory cells that remain in the second state is based at least in part on the detecting the absence of the respective snapback events for the first subset of memory cells.

17. An apparatus, comprising:
a memory array; and
a controller coupled with the memory array and configured to cause the apparatus to:
receive a command to write a first set of memory cells within the memory array to a first state and a second set of memory cells within the memory array to a second state; and
perform a first write operation on the first set of memory cells based at least in part on the command, wherein, to perform the first write operation, the controller is configured to cause the apparatus to:
apply a first pulse having a first polarity to the first set of memory cells;

identify, based at least in part on applying the first pulse and within the first set of memory cells, a subset of memory cells that are in the second state; and apply, based at least in part on the identifying the subset of memory cells, a second pulse having a second polarity to the subset of memory cells to write the subset of memory cells to the first state;

perform, concurrent with the first write operation, a second write operation on the second set of memory cells based at least in part on the command, wherein, to perform the second write operation, the controller is configured to cause the apparatus to:

apply a third pulse having the second polarity to the second set of memory cells; and apply, after applying third pulse, a fourth pulse having the first polarity to the second set of memory cells to write the second set of memory cells to the second state.

18. The apparatus of claim 17, wherein, to perform the first write operation, the controller is further configured to cause the apparatus to:

detect, based at least in part on applying the first pulse, respective snapback events for the subset of memory cells, wherein identifying the subset of memory cells that are in the second state is based at least in part on the respective snapback events for the subset of memory cells.

19. The apparatus of claim 18, wherein, to perform the first write operation, the controller is further configured to cause the apparatus to:

detect, based at least in part on applying the first pulse, an absence of respective snapback events for a second subset of memory cells within the first set of memory cells, wherein refraining from applying the second pulse to the second subset of memory cells based at least in part on the absence of the respective snapback events for the second subset of memory cells.

20. The apparatus of claim 18, further comprising:

a first sense component configured to sense one or more respective states of one or more of the first set of memory cells, wherein, to perform the first write operation, the controller is further configured to cause the apparatus to activate the first sense component, the identifying based at least in part on activating the first sense component; and a second sense component configured to sense one or more respective states of one or more of the second set of memory cells, wherein, to perform the second write operation, the controller is further configured to cause the apparatus to deactivate or maintain as deactivated the second sense component.

21. The apparatus of claim 20, further comprising:

a first set of latches configured to latch respective states of the first set of memory cells, wherein, to perform the first write operation, the controller is further configured to cause the apparatus to latch indications of the respective states of the first set of memory cells, the identifying based at least in part on the latching; and a second set of latches configured to latch respective states of the second set of memory cells, wherein, to perform the second write operation, the controller is further configured to cause the apparatus to refrain from latching indications of the respective states of the second set of memory cells.

22. The apparatus of claim 17, wherein the controller is further configured to cause the apparatus to:

apply the first pulse for a first duration;

apply the second pulse for a second duration that is smaller than the second duration;

apply the third pulse for a third duration; and apply the fourth pulse for a fourth duration that is larger than the third duration.

23. The apparatus of claim 17, wherein the controller is further configured to cause the apparatus to:

apply the first pulse for a first duration;

apply the third pulse for a third duration that is smaller than the first duration;

apply the second pulse for a second duration; and apply the fourth pulse for a fourth duration that is larger than the second duration.

24. The apparatus of claim 17, wherein:

the first set of memory cells are in a first portion of a memory array comprising a first set of word lines and bit lines; and the second set of memory cells are in a second portion of the memory array comprising a second set of word lines and bit lines different from the first set of word lines and bit lines.

25. An apparatus, comprising:

a memory array; and a controller coupled with the memory array and configured to cause the apparatus to:

receive a write command to write a first set of memory cells within the memory array to a first state and a second set of memory cells within the memory array to a second state;

apply, based at least in part on the write command, a first pulse having a first polarity to the first set of memory cells and the second set of memory cells;

apply a second pulse having the first polarity to a first subset of memory cells within the first set of memory cells, the first subset of memory cells identified as being in the second state based at least in part on the first pulse;

apply a third pulse having a second polarity to a second subset of memory cells within the second set of memory cells, the second subset of memory cells identified as being in the first state based at least in part on the first pulse;

apply a fourth pulse having the second polarity to a third subset of memory cells within the first set of memory cells, the third subset of memory cells identified as remaining in the second state based at least in part on the second pulse;

apply a fifth pulse having the first polarity to a fourth subset of memory cells within the second set of memory cells, the fourth subset of memory cells identified as remaining in the first state based at least in part on the third pulse;

apply, after the fourth pulse, a sixth pulse having the first polarity to the third subset of memory cells to write the third subset of memory cells to the first state; and apply, after the fifth pulse, a seventh pulse having the second polarity to the fourth subset of memory cells to write the fourth subset of memory cells to the second state.

* * * * *